(12) United States Patent
Jain et al.

(10) Patent No.: US 11,966,714 B2
(45) Date of Patent: Apr. 23, 2024

(54) TERNARY IN-MEMORY ACCELERATOR

(71) Applicant: Purdue Research Foundation, West Lafayette, IN (US)

(72) Inventors: Shubham Jain, West Lafayette, IN (US); Anand Raghunathan, West Lafayette, IN (US); Sumeet Kumar Gupta, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 98 days.

(21) Appl. No.: 17/588,311

(22) Filed: Jan. 30, 2022

(65) Prior Publication Data

US 2022/0206751 A1 Jun. 30, 2022

Related U.S. Application Data

(62) Division of application No. 16/581,965, filed on Sep. 25, 2019, now Pat. No. 11,281,429.

(51) Int. Cl.
| | |
|---|---|
| *G11C 11/412* | (2006.01) |
| *G06F 7/523* | (2006.01) |
| *G06F 17/16* | (2006.01) |
| *G06N 3/063* | (2023.01) |
| *G11C 11/418* | (2006.01) |
| *G11C 11/419* | (2006.01) |
| *G11C 15/04* | (2006.01) |

(52) U.S. Cl.
CPC ............. *G06F 7/523* (2013.01); *G06F 17/16* (2013.01); *G06N 3/063* (2013.01); *G11C 11/412* (2013.01); *G11C 11/418* (2013.01); *G11C 11/419* (2013.01); *G11C 15/04* (2013.01)

(58) Field of Classification Search
CPC ..... G11C 11/41; G11C 11/412; G11C 11/413; G11C 11/417; G11C 11/419; G11C 11/54; H10B 10/00; H10B 10/12
See application file for complete search history.

(56) References Cited

U.S. PATENT DOCUMENTS

2019/0102359 A1* 4/2019 Knag .................... G11C 11/418

* cited by examiner

*Primary Examiner* — Alfredo Bermudez Lozada
(74) *Attorney, Agent, or Firm* — Piroozi-IP, LLC

(57) ABSTRACT

A circuit of cells used as a memory array and capable of in-memory arithmetic which includes a plurality of signed ternary processing, each signed ternary processing cell includes a first memory cell, adapted to hold a first digital value, a second memory cell, adapted to hold a second digital value, wherein a binary combination of the first digital value and the second digital value establishes a first signed ternary operand, a signed ternary input forming a second signed ternary operand, and a signed ternary output, wherein the signed ternary output represents a signed multiplication of the first signed ternary operand and the second signed ternary operand, a sense circuit adapted to output a subtraction result.

7 Claims, 19 Drawing Sheets

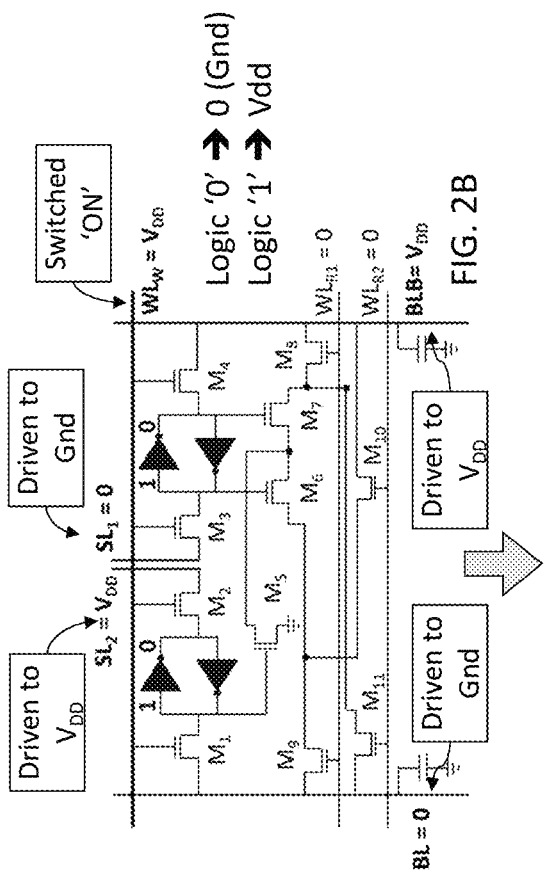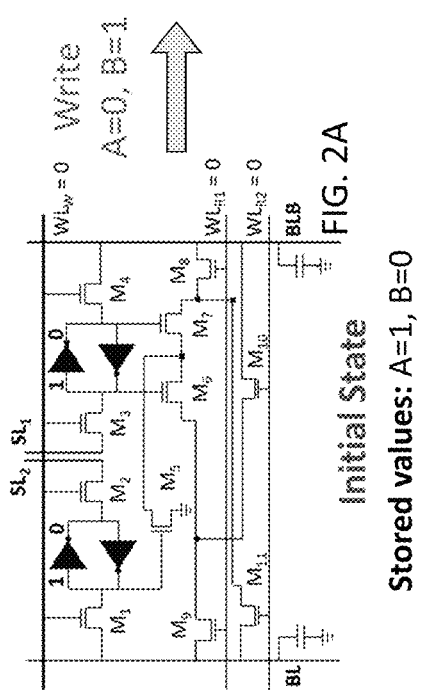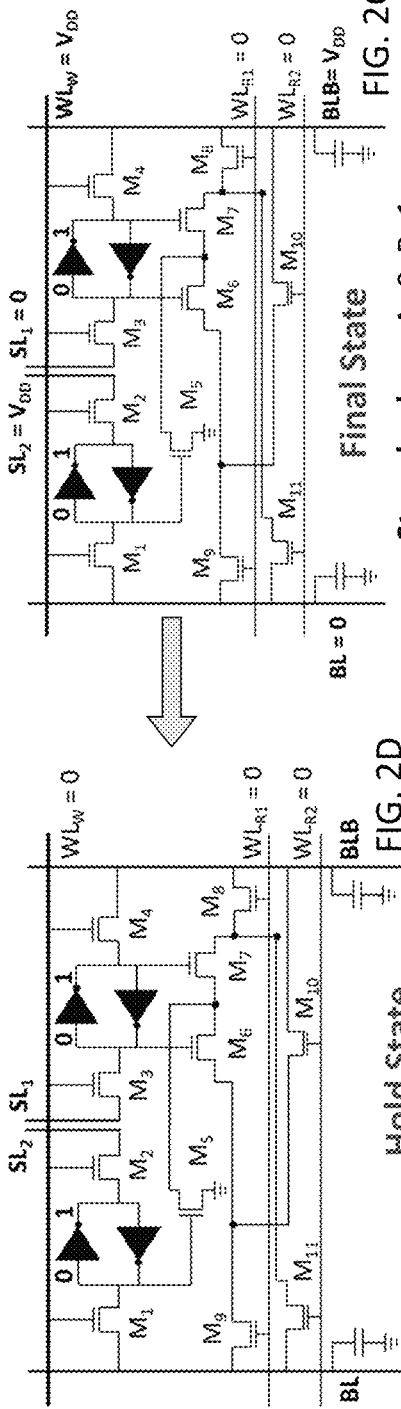

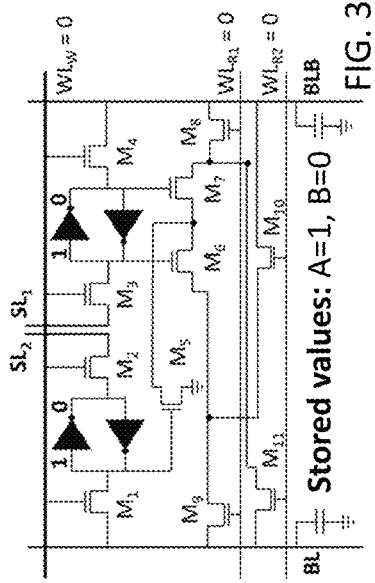
FIG. 3A
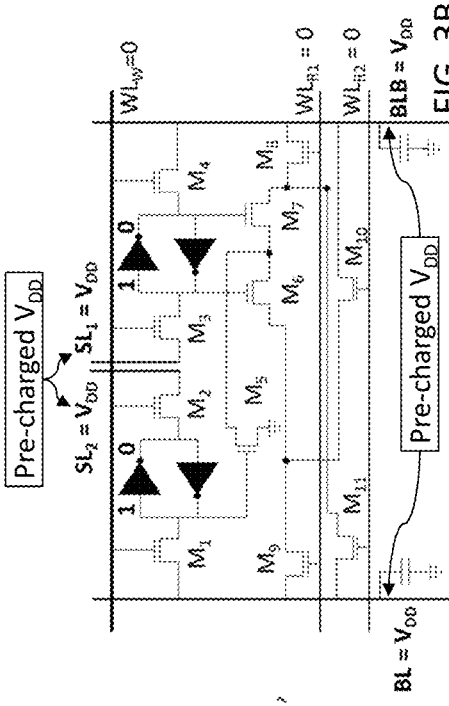
FIG. 3B
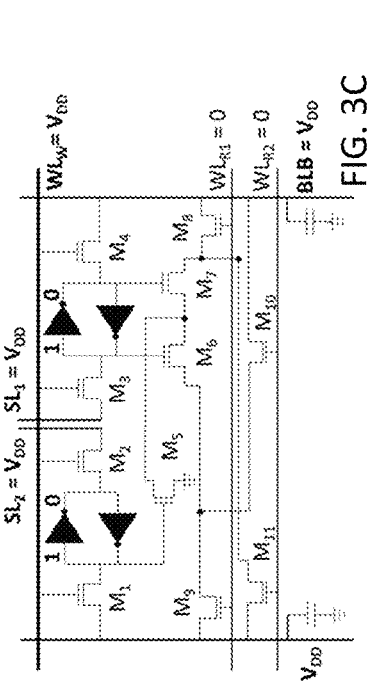
FIG. 3C
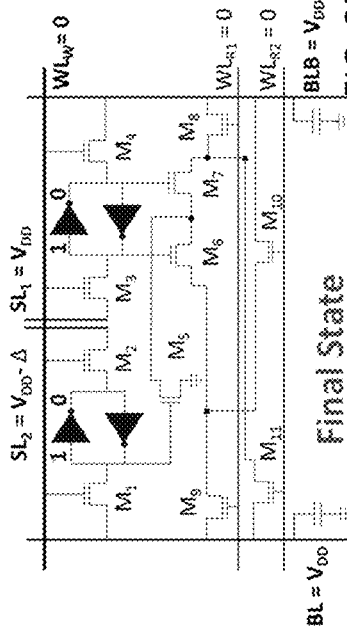
FIG. 3D

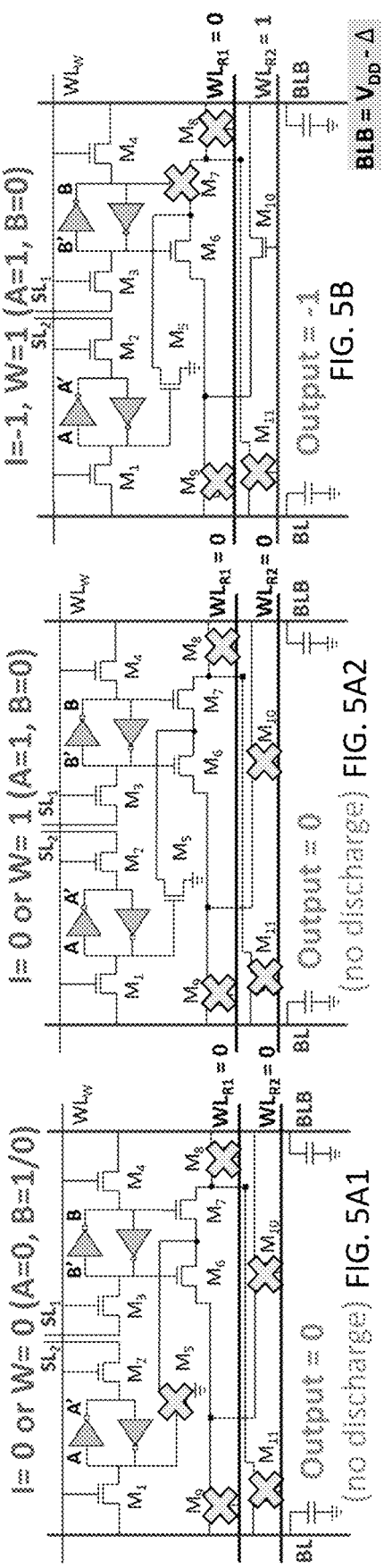
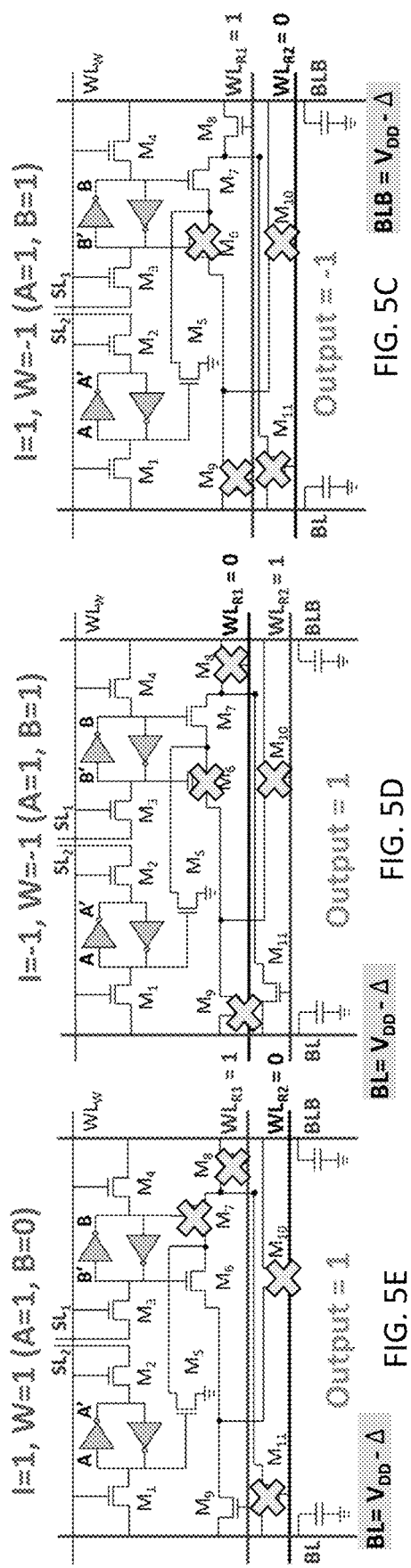

TERNARY IN-MEMORY ACCELERATOR

CROSS-REFERENCE TO RELATED APPLICATIONS

The present patent application is a divisional of U.S. Non-Provisional patent application Ser. No. 16/581,965 filed Sep. 25, 2019, the contents of which are hereby incorporated by reference in its entirety into the present disclosure.

STATEMENT REGARDING GOVERNMENT FUNDING

This invention was made with government support under Grant No. HR0011-18-3-0004 awarded by the Department of Defense/Defense Advanced Research Projects Agency (DARPA). The government has certain rights in the invention.

TECHNICAL FIELD

The present disclosure generally relates to in-memory computation, and in particular, to a ternary in-memory computation scheme.

BACKGROUND

This section introduces aspects that may help facilitate a better understanding of the disclosure. Accordingly, these statements are to be read in this light and are not to be understood as admissions about what is or is not prior art.

Traditionally, a computer's architecture has included (i) a processor, (ii) memory, and (iii) other peripheral components. This architecture is often referred to as the von-Neumann architecture, after its inventor. This architecture is based on decoupling the memory from the processor, and is found in millions of computers worldwide. A schematic of this architecture 1 is shown in FIG. 18, where a memory 2 is decoupled from the processor 4, and where the memory 2 and the processor 4 communicate via data exchange bus 6. While there has been an explosion of computing powers using this architecture, it is now failing to answer the call of data exchange in such applications as big-data, artificial intelligence, Internet-of-thins (IoT), and other data intensive operations. The shortcoming of this architecture is mainly due to a bottleneck 8 found between the memory 2 and the processor 4. This bottleneck 8 mainly arises from a limited data transfer rate between these two physically decoupled units. There are two major challenges with this bottleneck: (1) cycle time needed for data transfer (i.e., throughput), and (2) energy consumption associated with data transfer. To combat these two drawbacks associated with the bottleneck 8, one approach investigated in the prior art is to utilize in-memory vector computations. In such cases, not only does the decoupled memory maintain data it also provides rudimentary logic operations. These in-memory operations, thus, remove some of the issues associated with the bottleneck 8 as (1) data transfer between the memory 2 and the processor 4 is reduced, and (2) consequently energy consumption is also reduced.

However, there is an ever-increasing appetite for data and computations. For example, the advent of DNNs has drastically advanced the field of machine learning by enabling super-human accuracies for many cognitive tasks involved in image, video, and natural language processing. However, DNNs present a high computation cost that severely limits their ubiquitous adoption in energy and cost-constrained IoT devices. The use of lower precision to represent the weights and activations in DNNs is a promising technique for realizing DNN inference (evaluation of pre-trained DNN models) on energy-constrained platforms. Reduced bit-precision can lower all facets of energy consumption including computation, memory and interconnects. Current commercial hardware, includes widespread support for 8-bit and 4-bit fixed point DNN inference, and recent research has continued the push towards even lower precision. However, no efficient use of low-precision in-memory architecture has been proposed for high computational architectures.

In addition, ternary digital schemes have shown to provide an added advantage as compared to binary digital data when dealing with DNNs complex and demanding environments for both speed and energy consumption considerations. However, the in-memory schemes enabling ternary operations have been few in the prior art and also lack efficiency. This is particularly true for DNNs which are based on massive amount of multiply and accumulate operation.

Therefore, there is an unmet need for a novel approach adapted to provide in-memory operations for ternary logic.

SUMMARY

A ternary processing cell (TPC) used as a memory cell and capable of in-memory arithmetic is disclosed. The TPC includes a first memory cell, adapted to hold a first digital value. The TPC also includes a second memory cell, adapted to hold a second digital value. A binary combination of the first digital value and the second digital value establishes a first ternary operand. The TPC also includes a ternary input establishing a second ternary operand, as well as a ternary output. The ternary output represents a multiplication of the first ternary operand and the second ternary operand.

A circuit of cells used as a memory array and capable of in-memory arithmetic is also disclosed. The circuit includes a plurality of ternary processing cells each having a first bitline and a second bitline and coupled to each other in a parallel fashion such that the first bitlines of the plurality of ternary processing cells are coupled to each other and the second bitlines of the plurality of ternary processing cells are coupled to each other. Each ternary processing cell (TPC) includes a first memory cell, adapted to hold a first digital value, and a second memory cell, adapted to hold a second digital value. A binary combination of the first digital value and the second digital value establishes a first ternary operand. The TPC also includes a ternary input forming a second ternary operand. The TPC further includes a ternary output, wherein the ternary output represents a multiplication of the first ternary operand and the second ternary operand by voltage changes in the first and second bitlines. The circuit also includes a sense circuit adapted to (a) receive the coupled first and second bitlines of the plurality of ternary processing cells, (b) compute the difference between the values represented by the coupled first bitlines and the coupled second bitlines, and (c) output the subtraction result.

Another circuit of cells used as a memory array and capable of in-memory arithmetic is also disclosed. The circuit includes at least one block of ternary processing cells. The at least one block includes an output and a plurality of columns ($C_1 \ldots C_N$). Each column ($C_i$) includes a first bitline ($BL_i$), a second bitline ($BLB_i$), a plurality of ternary processing cells ($TPC_{1,Ci} \ldots TPC_{L,Ci}$) coupled to each other in a parallel fashion such that the first bitlines of the plurality of the TPCs in each column are coupled to each other and the second bitlines of the plurality of TPCs in each column are coupled to each other. Each ternary processing cell includes a first memory cell, adapted to hold a first digital value, a second memory cell, adapted to hold a second digital value, wherein a binary combination of the first digital value and the second digital value establishes a weight representing a first ternary operand, a ternary input representing a second ternary operand, and a ternary output. The ternary output represents a multiplication of the first ternary operand and the second ternary operand by voltage changes in the first and second bitlines. The plurality of columns ($C_1 \ldots C_N$) form a plurality of rows ($R_1 \ldots R_L$), each row ($R_i$) includes a first read wordline ($WL_{R1-i}$), a second read wordline ($WL_{\bar{R}1-i}$), the plurality of ternary processing cells ($TPC_{i,C1} \ldots TPC_{i,CN}$) coupled to each other in a parallel fashion such that the first read wordline of the plurality of the TPCs in each row are coupled to each other and the second read wordline of the plurality of TPCs in each row are coupled to each other. The circuit also includes at least one sense circuit adapted to (a) receive the coupled first and second bitlines of each column of the plurality of columns, (b) compute the difference between the values represented by the coupled first bitlines and the coupled second bitlines, and (c) output the subtraction result on the output of the at least one block, wherein, the output of the at least one block represents a vector matrix multiplication of an N×L matrix of the first ternary operands by L×1 of the second ternary operands resulting in the output vector of N×1.

BRIEF DESCRIPTION OF DRAWINGS

FIGS. 2A-2D are schematics of the TPC of FIG. 1 shown during a write operation.

FIGS. 3A-3D are schematics of the TPC of FIG. 1 shown during a read operation.

FIGS. 5A1, 5A2-5E are schematics of the TPC of FIG. 1 shown during a multiplication operation.

DETAILED DESCRIPTION

Figure 1:
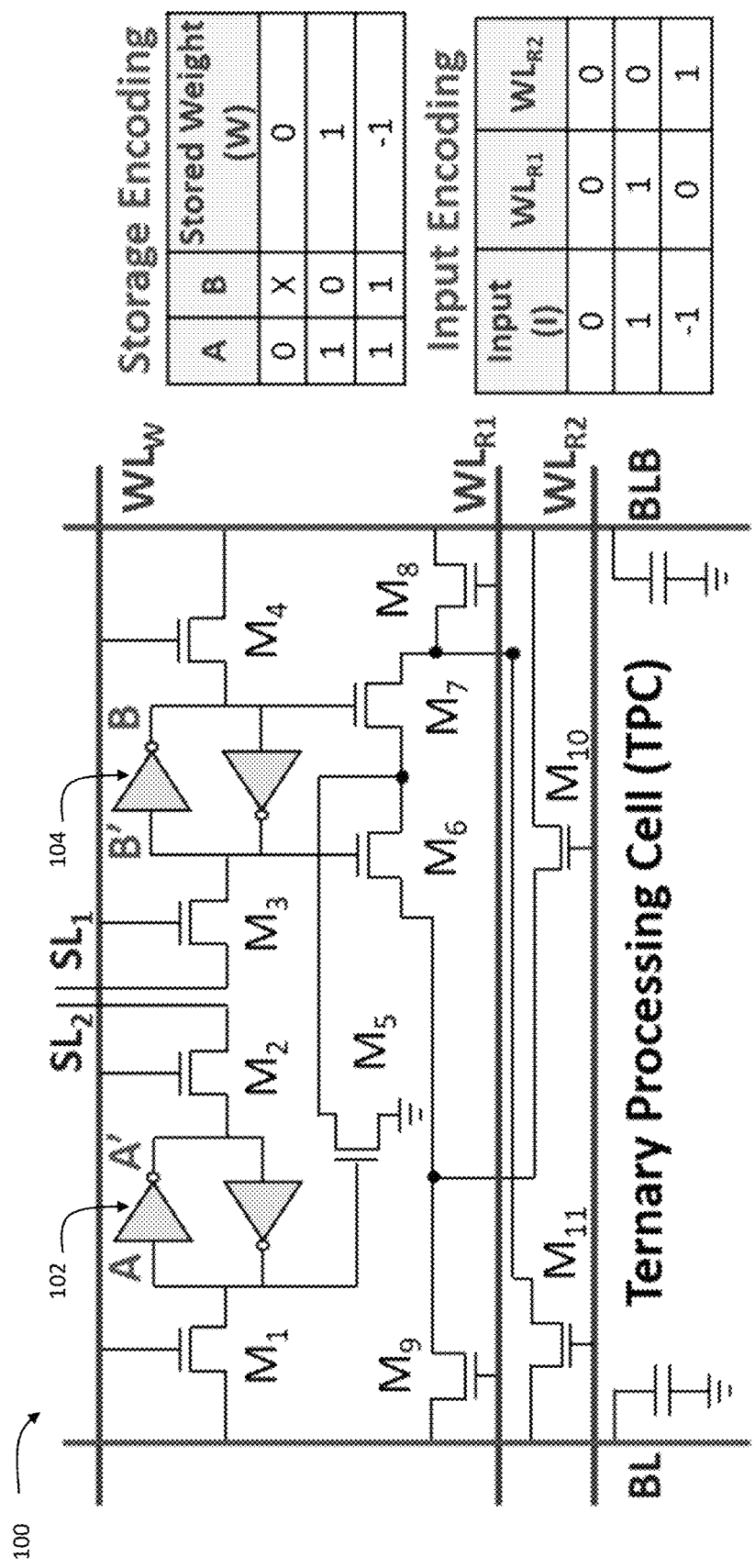
FIG. 1 is a circuit of a ternary processing cell (TPC), a building block of the circuits of the present disclosure.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

A novel approach adapted to provide in-memory operations for ternary logic has been disclosed herein. The in-memory operations are adapted to provide multiplication operations in memory and do so for ternary logic.

Prior art approaches suggest that among low precision networks, ternary DNNs represent a promising sweet-spot as they enable low-power inference with high application-level accuracy. This is illustrated in FIG. 1, which shows the reported accuracies of various state-of-the art binary, ternary, and full-precision (FP32) networks on complex image classification (ImageNet) and language modeling (PTB) tasks. Accuracy degradation of binary DNNs over the FP32 networks can be considerable (5-13% on image classification, 150 180 PPW [Perplexity Per Word] on language modeling). In contrast, ternary DNNs achieve accuracy significantly better than binary networks (and much closer to FP32 networks). In the present disclosure, the design of specialized hardware for realizing various state-of-the-art ternary DNNs is presented.

Ternary networks greatly simplify the multiply-and accumulate (MAC) operation that constitutes 95-99% of total DNN computations. Consequently, the amount of energy and time spent on DNN computations can be drastically improved by using lower-precision processing elements (the complexity of a MAC operation has a super-linear relationship with precision). However, when classical accelerator architectures (e.g., tensor processing units and graphic processing units) are adopted to realize ternary DNNs, the same challenge as the on-chip memory result in energy and performance bottleneck, wherein the data elements within a memory array are read sequentially (row-by-row). To this end, the present disclosure presents a scheme that explores in-memory computing in the specific context of ternary DNNs and demonstrate that it leads to significant improvements in performance and energy efficiency.

The scheme of the present disclosure is generally referred to as ternary in memory deep neural network (TiM-DNN) which differs in significant ways from any in-memory approaches of the prior art and is the first to apply in-memory computing adapted for massively parallel vector-matrix multiplications within memory array itself in an analog fashion using a new CMOS based bitcell.

The building block of TiM-DNN is a new memory cell, Ternary Processing Cell (TPC), which functions as both a ternary storage unit and a scalar ternary multiplication unit. Using TPCs, TiM tiles are presented herein which are specialized memory arrays to execute signed ternary dot-product operations. TiM-DNN comprises of a plurality of TiM tiles arranged into banks, wherein all tiles compute signed vector-matrix multiplications in parallel.

From a high level, a TiM-DNN, according to the present disclosure, is a programmable in-memory accelerator supporting various ternary representations including unweighted (−1,0,1), symmetric weighted (−a,0,a), and asymmetric weighted (−a,0,b) systems for realizing a broad range of ternary DNNs. The TPCs are thus used to function as both ternary storage and a ternary scalar multiplications unit while a TiM tile is used, according to one embodiment, as a specialized memory array to realize signed vector-matrix multiplication operations with ternary values.

To show feasibility, the aforementioned architecture was reduced to practice using an architectural simulator for evaluating TiM-DNN, with array-level timing and energy models obtained from circuit-level simulations. This experimental setup was utilized to evaluate an implementation of TiM-DNN in 32 nm CMOS using a suite of 5 popular DNNs designed for image classification and language modeling tasks. A 32-tile instance of TiM-DNN achieves a peak performance of 114 tera operations per second (TOPs/s), consumes 0.9 W power, and occupies 1.96 mm² chip area, representing a 300× improvement in TOPS/W compared to a state-of-the-art NVIDIA TESLA V100 GPU, as reported in the prior art. In comparison to low-precision accelerators, as also provided in the prior art, the TiM-DNN architecture of the present disclosure achieves 55.2×-240× improvement in TOPS/W. TiM-DNN also obtains 3.9×-4.7× improvement in system energy and 3.2×-4.2× improvement in performance over a well-optimized near-memory accelerator for ternary DNNs. These experimental reduction to practice demonstrate TiM-DNN achieves 3.9×-4.7× improvement in system level energy and 3.2×-4.2× speedup over a well-optimized near-memory accelerator. In comparison to the near-memory ternary accelerator, as reported in the prior art, it achieves 55.2× improvement in TOPS/W To begin, the present disclosure first provides a detailed discussion of the TPC. The TPC (ternary processing cell) operates as both a ternary storage unit and a ternary scalar multiplication unit. Referring to FIG. 1, a circuit of a ternary processing cell (TPC) 100, a building block of the present disclosure, is shown. The TPC 100 includes two sets 102 and 104 of cross-coupled inverters for storing two bits ('A' and 'B'), a write wordline ($WL_W$), two source lines ($SL_1$ and $SL_2$), two read wordlines ($WL_{R1}$ and $WL_{R2}$) and two bitlines (BL and BLB). The TPC 100 supports two operations: read/write and scalar ternary multiplication. A write operation is performed by enabling $WL_W$ and driving the sourcelines and the bitlines to either $V_{DD}$ or 0 depending on the data. Both bits can be written to simultaneously, with 'A' written using BL and $SL_2$ and 'B' written using BLB and $SL_1$. Using both bits 'A' and 'B' a ternary value (−1,0,1) is inferred based on the storage encoding shown in the Table of FIG. 2. For example, when A=0 the TPC stores W=0. When A=1 and B=0 the TPC stores W=1. When A=1 and B=1) the TPC 100 stores W=−1.

To better demonstrate the write operation, reference is made to FIGS. 2A-2D. FIG. 2A is a schematic of the TPC in an initial state where A=1 and B=0. In this initial state, $WL_W$=0, $WL_{R1}$=0, $WL_{R2}$=0. In this initial state, $SL_1$, $SL_2$, BL and BLB are don't cares (i.e., they can be left floating, connected to $V_{DD}$ or ground). In the initial state shown in FIG. 2A, FETs $M_4$ and $M_1$ are off. The states of each inverter pair is shown in FIG. 2A. For example, adjacent to $M_4$, the state of one inverter set associated with B is 0 (indicating the state of B), while adjacent to $M_1$, the state of the inverter set associated with A is 1 (indicating the state of A). The final state is shown in FIG. 2D which is a schematic of the TPC in a hold state where A=0 and B=1. In order to progress from the initial state shown in FIG. 2A to the final state shown in FIG. 2D, the TPC goes through transitional states shown in FIGS. 2B and 2C, which are schematics of the TPC in transition from the initial state to the final state. In the final state shown in FIG. 2D which is a schematic of the hold state of the TPC in the final state, FETs $M_4$ and $M_1$ are off. The states of each inverter pair is shown in FIG. 2D. For example, adjacent to $M_4$, the state of the inverter set associated with B is 1 (indicating the state of B), while adjacent to $M_1$, the state of the inverter set associated with A is 0 (indicating the state of A).

In order to transition from the initial state (FIG. 2A with A=1 and B=0) to the final state (FIG. 2D, with A=0 and B=1), in FIG. 2B, which is a schematic of the initial transition state of TPC, $WL_W$ is coupled to $V_{DD}$, $SL_1$ is coupled to ground, and $SL_2$ is coupled to $V_{DD}$. At the same time, BLB is coupled to $V_{DD}$ while BL is coupled to ground. With $WL_W$ coupled to $V_{DD}$, FETs $M_3$ and $M_4$ are turned on and thus a circuit is established from BLB (at $V_{DD}$) through the FET $M_4$, through the inverter set associated with B, and through $M_3$ to $SL_1$ which is at ground. This circuit thus overwrites the state of inverter set associated with B, as shown in FIG. 2C which is a schematic of the final transition state of TPC, in which $WL_W$ remains coupled to $V_{DD}$, $SL_1$ remains coupled to ground, $SL_2$ remains coupled to $V_{DD}$, BLB remains coupled to $V_{DD}$, and BL remains coupled to ground. As discussed above, the state of B was 0 in FIG. 2A, but in FIG. 2C the inverter set associated with B flips to a 1.

Similar to the situation with bit B, with $WL_W$ coupled to $V_{DD}$, FETs $M_1$ and $M_2$ are turned on and thus a circuit is established from BL (at ground) through the FET $M_1$, through the inverter set associated with A, and through $M_2$ to $SL_2$ which is at $V_{DD}$. This circuit thus overwrites the state of inverter set associated with A, as shown in FIG. 2C, in which $WL_W$ remains coupled to $V_{DD}$, $SL_1$ remains coupled to ground, $SL_2$ remains coupled to $V_{DD}$, BLB remains coupled to $V_{DD}$, and BL remains coupled to ground.

At this point, $WL_W$ is coupled to ground, thus turning off FETs $M_1$, $M_2$, $M_3$, and $M_4$, thus locking in the new states of A and B (i.e., A=0 and B=1). This is shown in FIG. 2D. As in FIG. 2A, BLB and BL in FIG. 2D are don't cares.

To better demonstrate the read operation, reference is made to FIGS. 3A-3D. FIG. 3A is a schematic of the TPC in an initial state where A=1 and B=0. In this initial state, $WL_W$=0, $WL_{R1}$=0, $WL_{R2}$=0. In this initial state, $SL_1$, $SL_2$, BL and BLB are don't cares (i.e., they can be left floating, connected to $V_{DD}$ or ground). At the end of the read cycle, a general observation regarding read of B is a comparison of $SL_1$ and BLB. If $SL_1$<BLB then then B=1; if however, $SL_1$>BLB, then B=0. Similarly, at the end of the read cycle, a general observation regarding read of A is a comparison of $SL_2$ and BL. If $SL_2$<BL then then A=1; if however, $SL_2$>BL, then A=0. It should be noted that for read operations, $WL_{R1}$ and $WL_{R2}$ are maintained at 0. Consequently, FETs $M_8$, $M_9$, $M_{10}$, and $M_{11}$ remain off. The states of each inverter pair is shown in FIG. 3A. For example, the state of one inverter set associated with B is 0 (indicating the state of B), while the state of the inverter set associated with A is 1 (indicating the state of A). The final state is shown in FIG. 3D which is a schematic of the TPC after A and B have been read. In order to progress from the initial state shown in FIG. 3A to the final state shown in FIG. 3D, the TPC goes through transitional states shown in FIGS. 3B and 3C, which are schematics of the TPC in transition from the initial state to the final state. These transitional states include step 1, where BL, $SL_1$, $SL_2$, and BLB are precharged to $V_{DD}$. Between step 1 and step 2 shown in FIGS. 3B and 3C, $WL_W$ is turned on for a short predetermined amount of time (i.e., connected to $V_{DD}$). With $WL_W$ turned on, $M_1$ and $M_4$ are temporarily turned on establishing a path for BL and BLB to the inverter pairs. Since A=1, the established path to BL does not cause any change in the BL capacitor. However, since B=0, BLB capacitor begins to discharge by Δ volts for the duration of time that $M_4$ (i.e., $WL_W$) is on. Once $WL_W$ is turned off, $M_4$ and $M_1$ are also turned off. At the same time, $M_2$ and $M_3$ and are also temporarily turned on (i.e., when $WL_W$ is temporarily turned on). With $M_3$ on, $SL_1$ is connected to the output of B' (i.e., inverse of B). Since B=0, B'=1, thus no discharge occurs on $SL_1$. However, with $M_2$ on, $SL_2$ is connected to the output of A' (i.e., inverse of A). Since A=1, A'=0, thus $SL_2$ discharges by Δ volts for the duration of the amount of time that $WL_W$ is on. Comparing BLB to $SL_1$ reveals that BLB has been discharged and $SL_1$ has not. As a result, $SL_1$>BLB and thus B is read to be a 0. Conversely, Comparing BL to $SL_2$ reveals that BL has not been discharged while $SL_2$ has. As a result, $SL_2$<BL and thus A is read to be a 1. $SL_1$, $SL_2$, BL and BLB are coupled to high impedance readers and interrogated for their status.

With the read and write operations explained, reference is now made to the multiplication functionality of the TPC. A scalar multiplication in a TPC is performed between a ternary input, also referred to herein as the second ternary operand, and the stored weight, also referred to herein as the first ternary operand, to obtain a ternary output. The bitlines are precharged to $V_{DD}$, and subsequently, the ternary inputs are applied to the read wordlines ($WL_{R1}$ and $WL_{R2}$) based on the input encoding scheme shown in FIG. 1 (with the associated table). The final bitline voltages ($V_{BL}$ and $V_{BLB}$) depend on both the input (I) and the stored weight (W). Recall from FIG. 1 that the stored weight is based on the bits A and B. For example, when A is 0, regardless of B's value, W=0; when A=1 and B=0, W=1; and when A=1 and B=1, W=-1.

Figure 4:
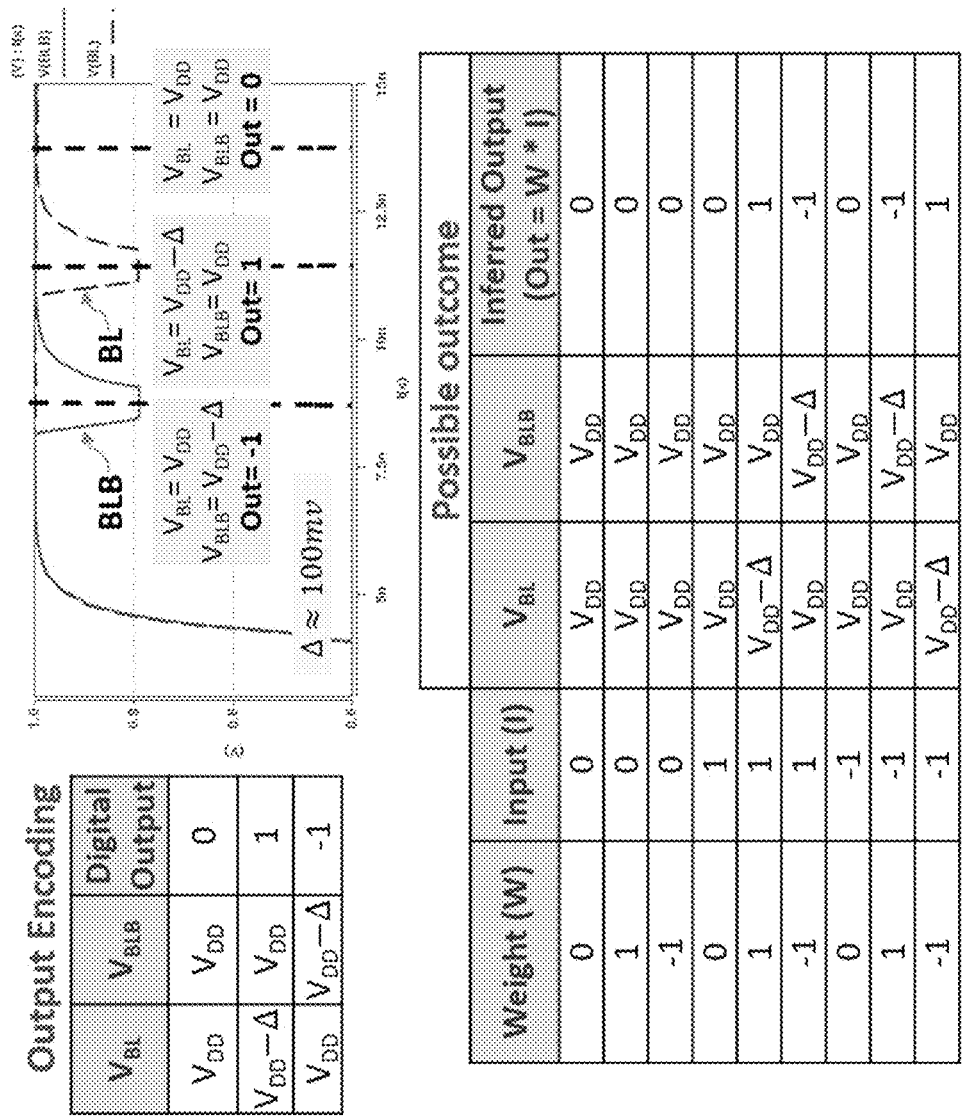
FIG. 4 are graphical representations of output encoding of the TPC of FIG. 1.

Table in FIG. 4 details the possible outcomes of the scalar ternary multiplication (W*I), where I is the input, with the final bitline voltages and the inferred ternary output (Out). For example, when W=0 or I=0, the bitlines (BL and BLB) remain at $V_{DD}$ and the output is inferred as 0 (W*I=0). When W=I=1, BL discharges by a certain voltage, denoted by Δ, and BLB remains at $V_{DD}$. This is inferred as Out=1. In contrast, when W=-I=1, BLB discharges by Δ and BL remains at $V_{DD}$ producing Out=-1. The final bitline voltages are converted to a ternary output using single-ended sensing at BL and BLB. FIG. 4 depicts the output encoding scheme and the results of SPICE simulation of the scalar multiplication operation with various possible final bitline voltages. Note that, the TPC design uses separate read and write paths to avoid read disturb failures during in-memory multiplications.

To better demonstrate the multiplication operation, reference is now made to FIG. 5A1, 5A2-5E, which show different states of multiplication operation in schematic forms. In general, BL and BLB are initially pre-charged, and $WL_{R1}$ and $WL_{R2}$ are toggled, as described below for a short amount of time. After such toggling, BL and BLB voltages are read and the output of the multiplication inferred based on the table provided in FIG. 4. In these figures the "X" mark refers to associated transistors in either the off state (i.e., high impedance) or if in the on state, connected to floating nodes. FIG. 5A1 is a schematic of the TPC indicating an exemplary state of the multiplication operation. In this case, either I=0 or W=0 (recall W=0 when A=0 regardless of what B is, see FIG. 1). Here, $WL_{R1}$ and $WL_{R2}$ are both connected to ground. The "X" is placed on transistor $M_5$, which means it is off (i.e., high impedance). This is because A=0, which means $M_5$ is off. As a result there are no discharge on either BL or BLB and these both remain at $V_{DD}$, indicating an output of 0. FIG. 5A2 is a schematic of the TPC indicating another exemplary state of the multiplication operation. In this case, I=0 but W=1 (recall W=1 when A=1 and B=0, see FIG. 1). Here, $WL_{R1}$ and $WL_{R2}$ are both connected to ground. Transistor $M_5$ is no longer off, since A=1, however, $M_7$ and $M_8$ are both off, and thus $M_5$ while on is connected to a high impedance node. As a result there are no discharge on either BL or BLB and these both remain at $V_{DD}$, indicating an output of 0. FIG. 5B is a schematic of the TPC indicating another exemplary state of the multiplication operation. In this case, I=-1 and W=1 (recall W=1 when A=1 and B=0, see FIG. 1). Here, $WL_{R1}$ is set to 0 and $WL_{R2}$ is temporarily connected to $V_{DD}$ (see table in FIG. 1). In this case, $M_7$, $M_8$, and $M_9$ are off and thus have "X" placed on them (since B=0 and $WL_{R1}$=0). In addition, $M_{11}$ has an "X" placed on it indicating while it is on, it is connected to a high impedance node. As a result there is no discharge on BL and it remains at $V_{DD}$, however BLB discharges by Δ for the duration of time $WL_{R2}$ is high and thus becomes $V_{DD}$-Δ, indicating an output of -1 (BL=$V_{DD}$ and BLB=$V_{DD}$-Δ), see FIG. 4. FIG. 5C is a schematic of the TPC indicating another exemplary state of the multiplication operation. In this case, I=1 and W=-1 (recall W=-1 when A=1 and B=1, see FIG. 1). Here, $WL_{R2}$ is set to 0 and $WL_{R1}$ is temporarily connected to $V_{DD}$. In this case, $M_6$, $M_{10}$, and $M_{11}$ have "X" placed on them indicating they are turned off (since $WL_{R2}$ is low and B' is also low since B=1). As a result there is no discharge on BL and it remains at $V_{DD}$ however BLB discharges by Δ for the duration of time $WL_{R1}$ is on and thus becomes $V_{DD}$-Δ, indicating an output of -1 (BL=$V_{DD}$ and BLB=$V_{DD}$-Δ). FIG. 5D is a schematic of the TPC indicating another exemplary state of the multiplication operation. In this case, I=1 and W=-1 (recall W=-1 when A=1 and B=1, see FIG. 1). Here, $WL_{R1}$ is set to 0 and $WL_{R2}$ is temporarily connected to $V_{DD}$. In this case, $M_6$, $M_8$, and $M_9$ have "X" placed on them indicating they are turned off (since $WL_{R1}$=0) and $M_{10}$ also has an "X" on it since while is on temporarily ($WL_{R1}$=1), it is connected to a high impedance node. This is because B'=0 since B=1. As a result there is no discharge on BLB and it remains at $V_{DD}$ however BL discharges by Δ for the duration of time that $WL_{R1}$=1 and thus becomes $V_{DD}$-Δ, indicating an output of 1 (BL=$V_{DD}$-Δ and BLB=$V_{DD}$). FIG. 5E is a schematic of the TPC indicating another exemplary state of the multiplication operation. In this case, I=1 and W=1 (recall W=1 when A=1 and B=0, see FIG. 1). Here, $WL_{R2}$ is set to 0 and $WL_{R1}$ is temporarily connected to $V_{DD}$. In this case, $M_7$, $M_{10}$, and $M_{11}$ have "X" placed on them indicating they are turned off (since WLR2=0 and B=0) as well as $M_8$ with an "X" on it since while it is on ($WL_{R1}$ is temporarily connected to 1), it is connected to a high impedance node. As a result there is no discharge on BLB and it remains at $V_{DD}$, however BL discharges by $\Delta$ for the duration of time WLR1 is turned on and thus becomes $V_{DD}$-$\Delta$, indicating an output of 1 (BL=$V_{DD}$-$\Delta$ and BLB=$V_{DD}$).

Figures 6A, 6B:
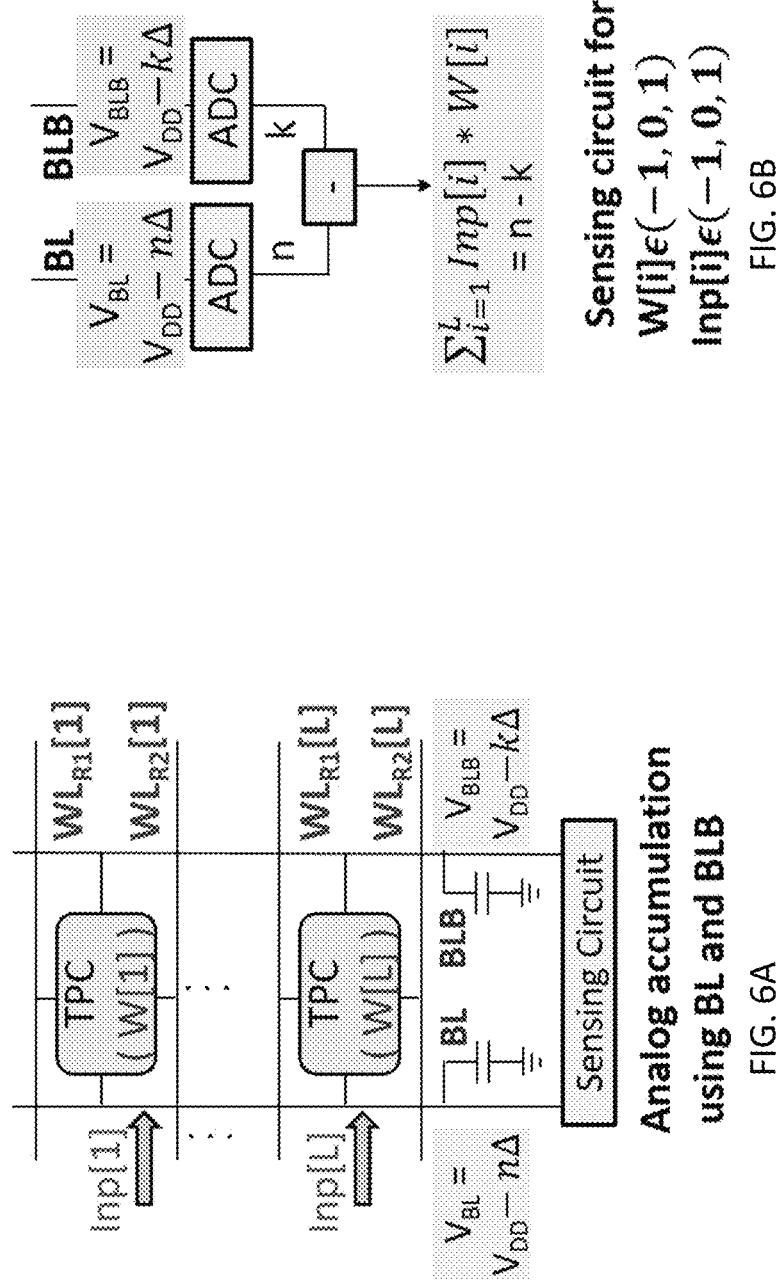
FIG. 6A is a schematic of a plurality of TPCs of FIG. 1 put together to produce a dot product operation.
FIG. 6B is a schematic representation showing a sensing circuit used according to one embodiment of the present disclosure to realize the dot-product of FIG. 6A with unweighted (−1,0,1) ternary weights and inputs.

Next we consider the dot product. FIG. 6A is a schematic of an exemplary dot product operation. FIG. 6A provide the mapping of a dot-product operation ($\Sigma_{i=0}^{L}$Inp[i]*W[i]) to a column of TPCs with shared bitlines, where Inp[i] corresponds to I for each TPC. To compute, first the bitlines are precharged to $V_{DD}$, and then the inputs (Inp) are applied to all TPCs simultaneously. The bitlines (BL and BLB) function as an analog accumulator, wherein the final bitline voltages ($V_{BL}$ and $V_{BLB}$) represent the sum of the individual TPC outputs. For example, if 'n/L' and 'k/L' TPCs have output 1 and −1, respectively, the final bitline voltages are $V_{BL}$=$V_{DD}$-n$\Delta$ and $V_{BLB}$=$V_{DD}$-k$\Delta$. The bitline voltages are converted using Analog-to-Digital converters (ADCs) to yield digital values 'n' and 'k'. For the unweighted encoding where the ternary weights are encoded as (−1,0,1), the final dot-product is 'n−k'. FIG. 6B is a schematic representation providing the sensing circuit used according to one embodiment of the present disclosure to realize dot-product with unweighted (−1,0,1) ternary system. Suppose, four TPCs ($TPC_1$, $TPC_2$, $TPC_3$, and $TPC_4$) are connected in the manner shown in FIG. 6A. Also, suppose IW for each of these TPCs is $I_1W_1$=10, $I_2W_2$=11, $I_3W_3$=−11, and $I_4W_4$=−1−1. BL and BLB for each TPC after the multiplication results in $BL_1$/$BLB_1$=VDD/VDD, $BL_2$/$BLB_2$=VDD-$\Delta$/VDD (see FIG. 5E), $BL_3$/$BLB_3$=VDD/VDD-$\Delta$ (see FIG. 5C), and $BL_4$/$BLB_4$=VDD-$\Delta$/VDD (see FIG. 5D). As a result BL has an accumulation of VDD-2$\Delta$ and BLB has an accumulation of VDD-$\Delta$. In this case, n=2 and k=1. By subtracting BLB's accumulation from BL's accumulation (i.e., n−k), the result is 1. This result agrees with individual results of adding the output of the four TPCs based on the inferred results provided in FIG. 4. In other words, outputs of $TPC_1$-$TPC_4$ are 0, 1, −1, 1, respectively. Adding these numbers result in 1 which agrees with the accumulation scenario discussed above.

Figure 7A:
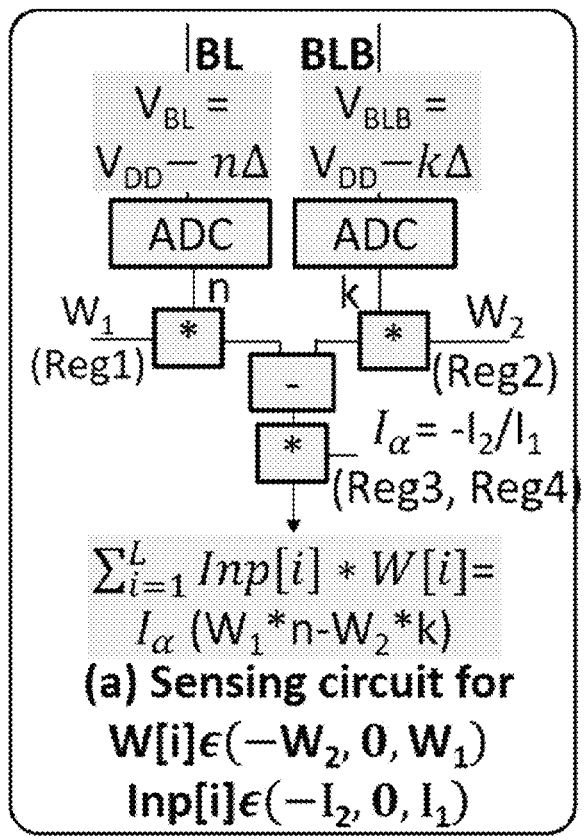
FIG. 7A is a schematic which shows a sensing circuit that enables dot product with asymmetric ternary weights ($W_2$, 0, $W_1$) and inputs ($I_2$, 0, $I_1$).
Figure 7B:
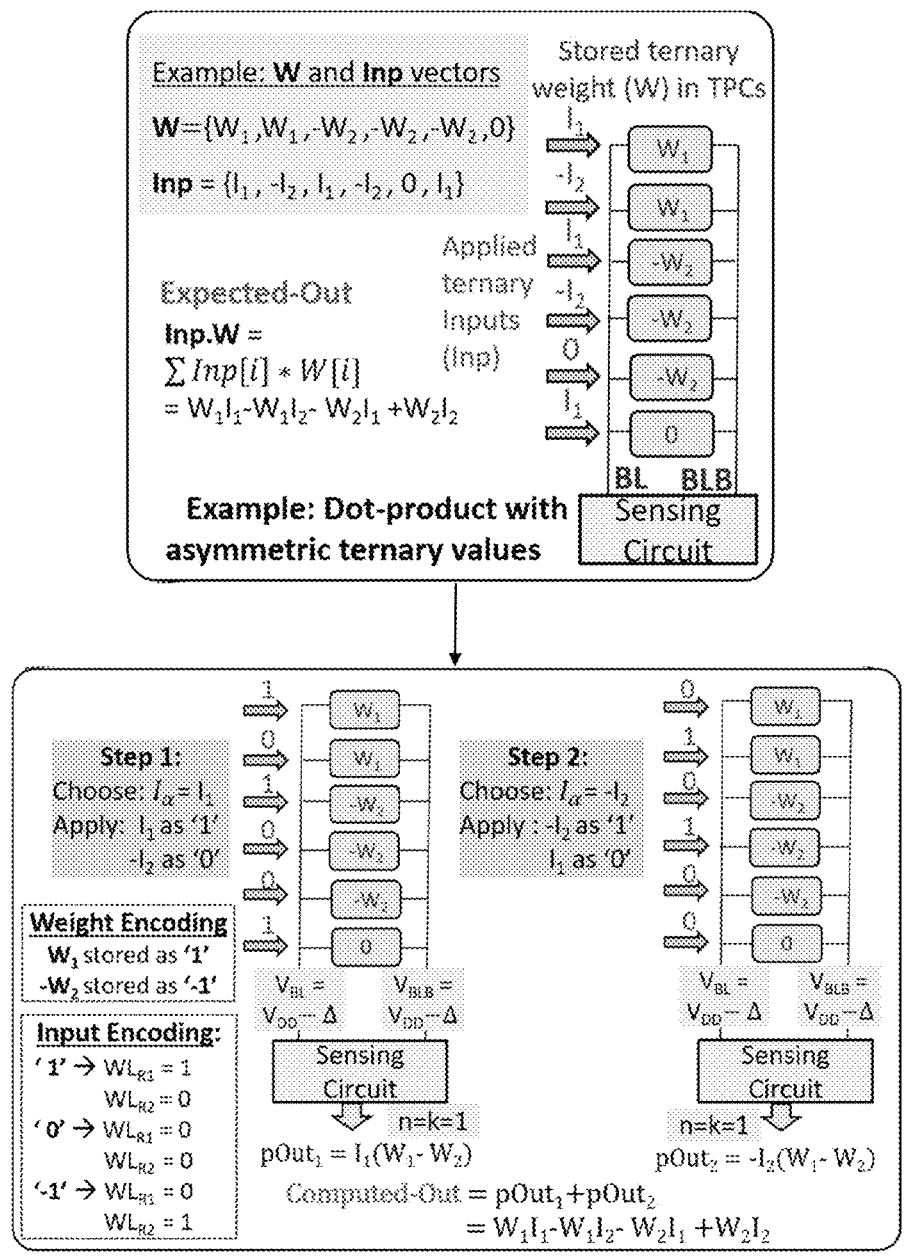
FIG. 7B is a schematic of a circuit for determining output of a dot product with asymmetric weights of FIG. 7A.

We can also realize dot-products with a more general ternary encoding represented by asymmetric weighted (−a, 0,b) values. FIG. 7A is a schematic which shows the sensing circuit that enables dot product with asymmetric ternary weights ($W_2$, 0, $W_1$) and inputs ($I_2$, 0, $I_1$). As shown, the ADC outputs are scaled by the corresponding weights ($W_1$ and $W_2$), and subsequently, an input scaling factor ($I_\alpha$) is applied to yield '$I_\alpha$($W_1$*n$W_2$*k)'. In contrast to dot-product with unweighted values, two execution steps are needed to realize dot-products with the asymmetric ternary system, wherein each step a partial dot-product (pOut) is computed. FIG. 7B shows these two steps using one example. In step 1, $I_\alpha$ is chosen as $I_1$, and applies $I_1$ and $I_2$ as '1' and '0', respectively, resulting in a partial output (pOut) given by $pOut_1$=$I_1$($W_1$*n−$W_2$*k). In step 2, $I_\alpha$ is chosen as −$I_2$, and applies $I_1$ and $I_2$ as '0' and '1', respectively, to yield $pOut_2$=−$I_2$($W_1$*n−$W_2$*k). The final dot product is given by '$pOut_1$−$pOut_2$'.

Figure 8:
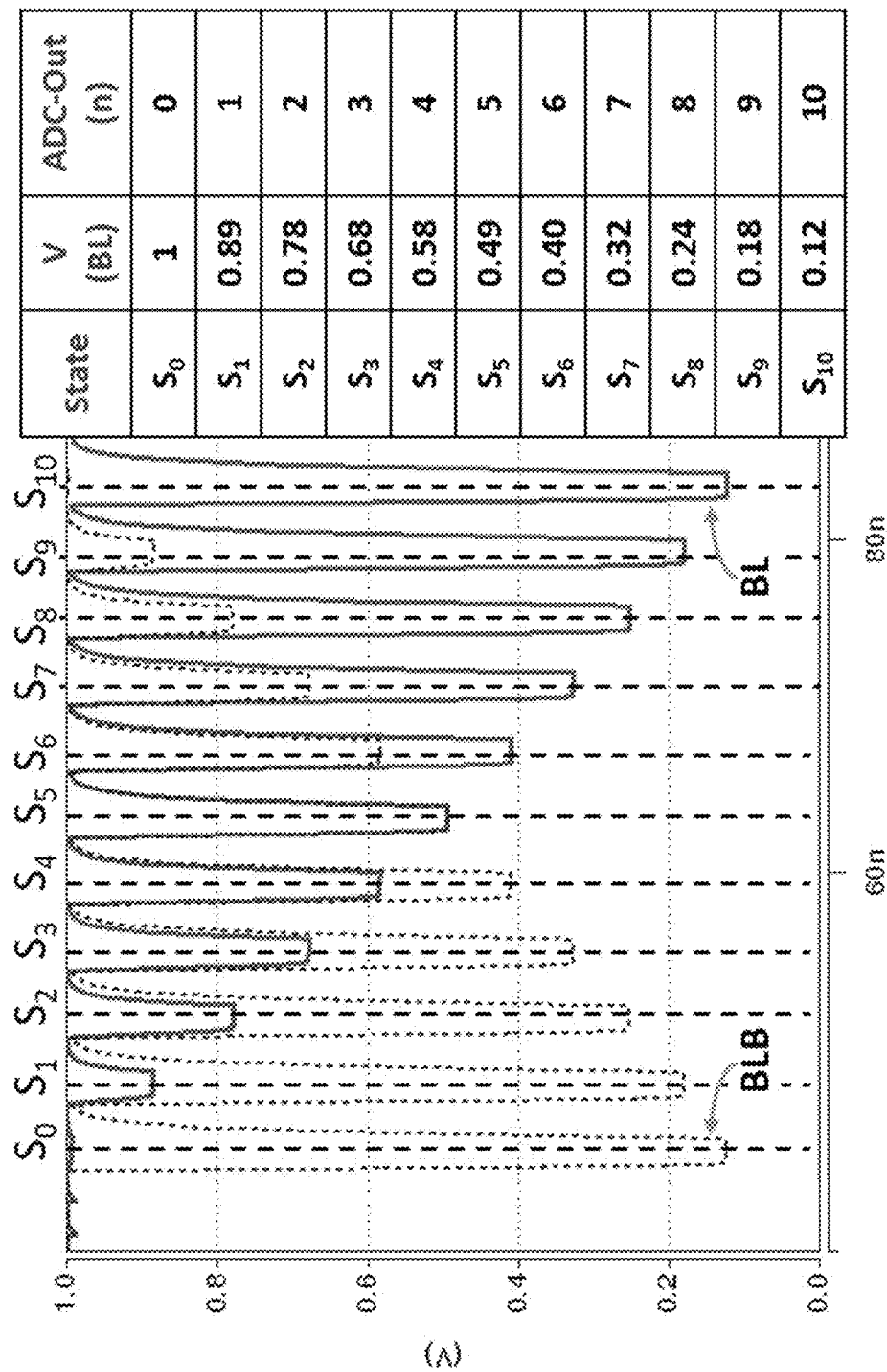
FIG. 8 is a graph of voltage vs. time which shows various bitline states ($S_0$ to $S_{10}$) and the corresponding value of $V_{BL}$ and the corresponding ADC output.

To demonstrate the validity of the aforementioned dot product methodology, a detailed SPICE simulation is provided to show the final voltages at BL ($V_{BL}$) and BLB ($V_{BLB}$). FIG. 8 is a graph of voltage vs. time which shows various BL states ($S_0$ to $S_{10}$) and the corresponding value of $V_{BL}$ and 'n'. Note that the possible values for $V_{BLB}$ ('k') and $V_{BL}$ ('n') are identical, as BL and BLB are symmetric. The state $S_i$ refers to the scenario where 'i' out of 'L' TPCs compute an output of '1'. It should be noted that from $S_0$ to $S_7$ the average sensing margin ($\Delta$) is 96 mv. The sensing margin decreases to 6080 my for states $S_8$ to $S_{10}$, and beyond $S_{10}$ the bitline voltage ($V_{BL}$) saturates. Therefore, we can achieve a maximum of 11 BL states ($S_0$ to $S_{10}$) with sufficiently large sensing margin required for sensing reliably under process variations (e.g., 32 nm with variations of $$\left(\frac{\sigma}{\mu} = 5\%\right)$$

in transistor $V_T$). The Maximum value of 'n' and 'k' is thus 10, which in turn determines the number of TPCs ('L') that can be enabled simultaneously. Setting L=$n_{max}$=$k_{max}$ would be a conservative choice. However, exploiting the weight and input sparsity of ternary DNNs], wherein 40% or more of the elements are zeros, and the fact that non-zero outputs are distributed between '1' and '−1', a design, according to one embodiment is chosen with $n_{max}$=8, and L=16. The experiments indicate that this choice had no effect on the final DNN accuracy compared to the conservative case. In the present disclosure, results of evaluation from the impact of process variations on the dot-product operations realized using TPCs, are provided below.

Figure 9:
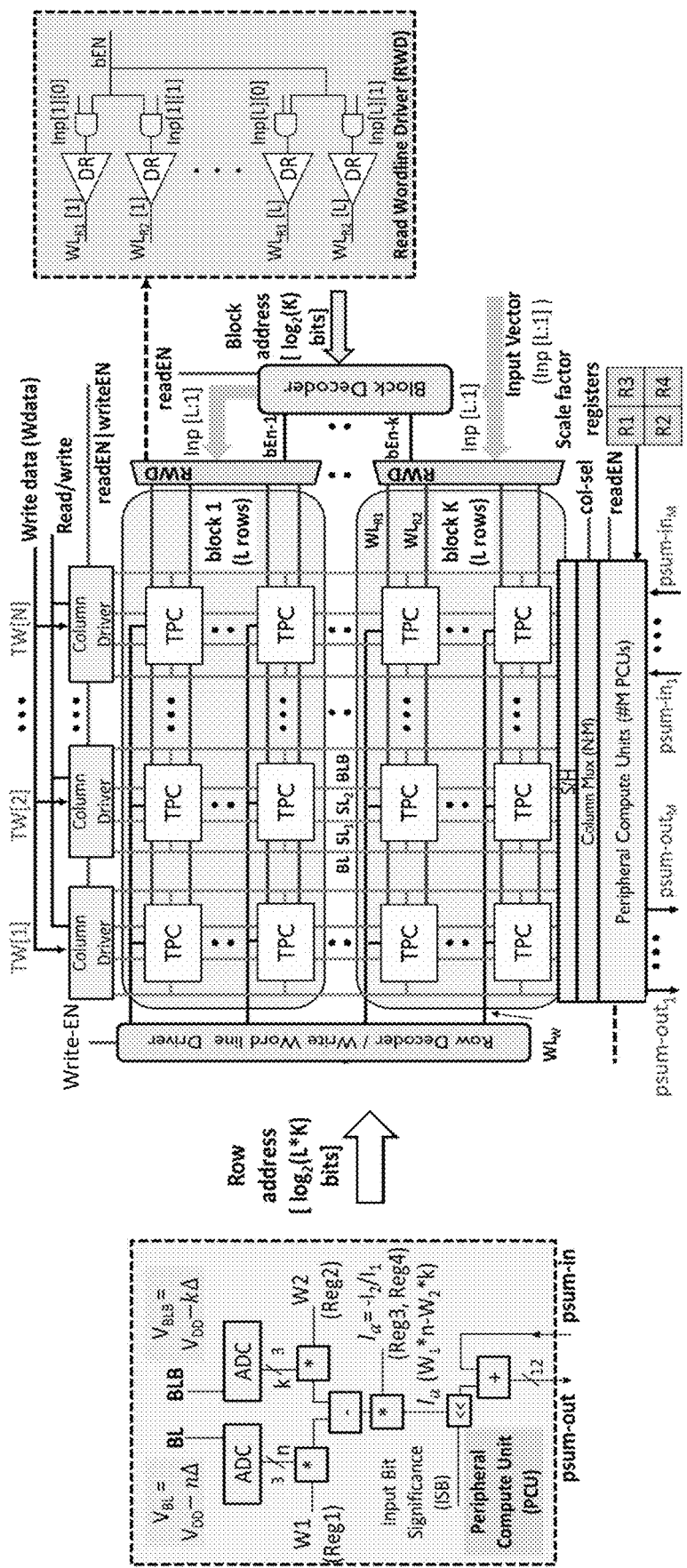
FIG. 9 is a schematic of details of a tile design, according to the present disclosure, which includes blocks of TPC each in a matrix layout.

Having demonstrated the properties of the TPC in the form of write, read, multiplication, and dot product (for both unweighted and weighted embodiments), reference is now turned to the tile aspect of the TPC (TiM), which is a specialized memory array designed using TPCs to realize massively parallel vector matrix multiplications with ternary values. Referring to FIG. 9 details the tile design, which includes a 2D array of TPCs, a row decoder and write wordline driver, a block decoder, Read Wordline Drivers (RWDs), column drivers, a sample and hold (S/H) unit, a column mux, Peripheral Compute Units (PCUs), and scale factor registers. The TPC array contains 'L*K*N' TPCs, arranged in 'K' blocks and 'N' columns, where each block contains 'L' rows. As shown in the figure, TPCs in the same row share wordlines and TPC in the same column share bitlines and source-lines. The tile supports at least two major functions, (i) programming, i.e., row-by-row write operations, and (ii) a vector-matrix multiplication operation. A write operation is performed by activating a write wordline ($WL_W$) using the row decoder and driving the bitlines and source-lines. During a write operation, 'N' ternary words (TWs) are written in parallel. In contrast, to the row-wise write operation, a vector-matrix multiplication operation is realized at the block granularity, wherein 'N' dot product operations each of vector length 'L' are executed in parallel. The block decoder selects a block for the vector matrix multiplication, and RWDs apply the ternary inputs. During the vector-matrix multiplication, TPCs in the same row share the ternary input (Inp), and TPCs in the same column produce partial sums for the same output. As discussed in section III-B, accumulation is performed in the analog domain using the bitlines (BL and BLB). In one access, TiM can compute the vector-matrix product Inp. W, where Inp is a vector of length L and W is a matrix of dimension L×N stored in TPCs. The accumulated outputs at each column are stored using a sample and hold (S/H) unit and get digitized using PCUs. To attain higher area efficiency, we utilize 'M'

PCUs per tile ('M'<'N') by matching the bandwidth of the PCUs to the bandwidth of the TPC array and operating the PCUs and TPC array as a two-stage pipeline.

Reference is now made to several components of the TiM arrangement shown in FIG. 9. FIG. 9 shows the RWD logic that takes a ternary vector (Inp) and block enable (bEN) signal as inputs and drives all 'L' read wordlines ($WL_{R1}$ and $WL_{R2}$) of a block. The block decoder generates the bEN signal based on the block address that is an input to the TiM tile. $WL_{R1}$ and $WL_{R2}$ are activated using the input encoding scheme shown in FIG. 1 (See Table in FIG. 1).

FIG. 9 also shows the logic for a PCU, which includes two ADCs and a few small arithmetic units (adders and multipliers). The primary function of PCUs is to convert the bitline voltages to digital values using ADCs. However, PCUs also enable other key functions such as partial sum reduction, and weight (input) scaling for weighted ternary encoding $(-W_2, 0, W_1)$ and $(-I_2, 0, I_1)$. Although the PCU can be simplified if $W_2=W_1=1$ or/and $I_2=I_1=1$, in the present disclosure, emphasis is placed on a programmable TiM tile that can support various state-of-the-art ternary DNNs. To further generalize, we use a shifter to support DNNs with ternary weights and higher precision activations. The activations are evaluated bit-serially using multiple TiM accesses. Each access uses an input bit, and we shift the computed partial sum based on the input bit significance using the shifter. TiM tiles have scale factor registers (shown in FIG. 9) to store the weight and the activation scale factors that vary across layers within a network.

Figure 10:
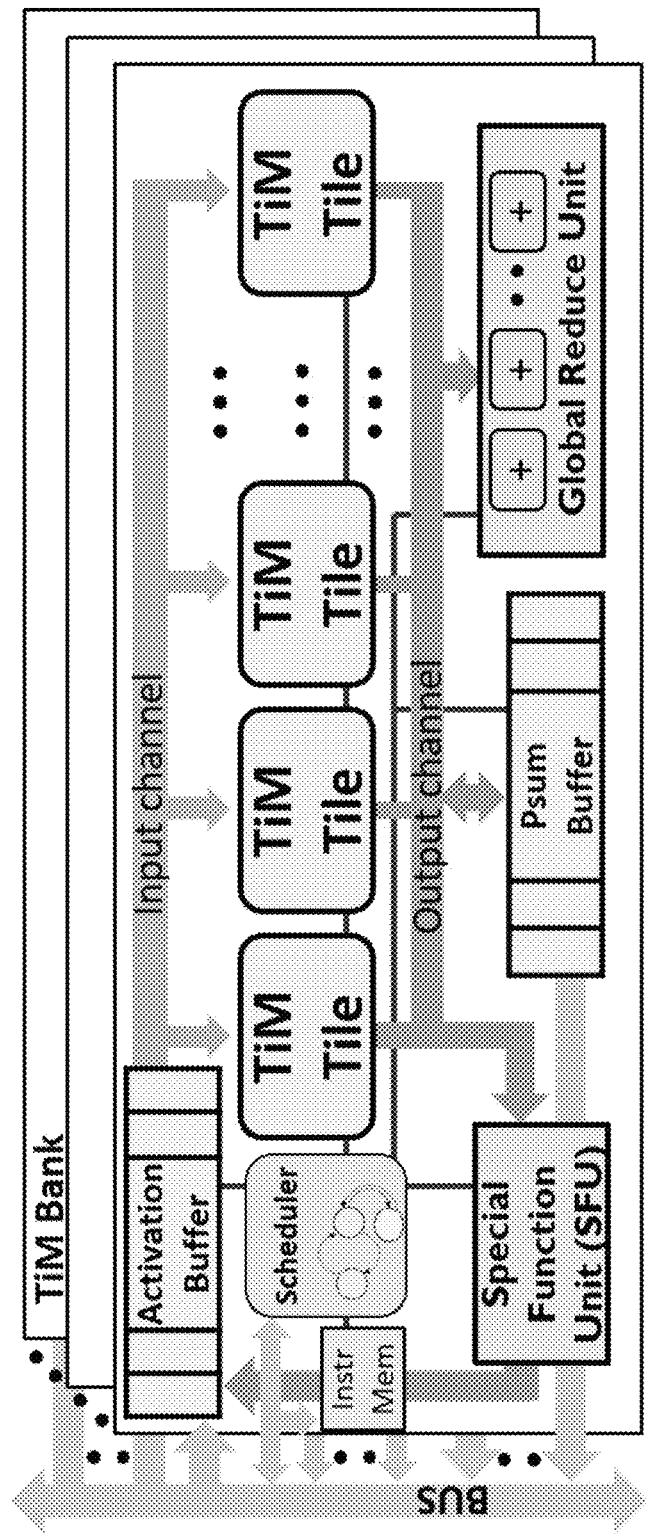
FIG. 10 is a block diagram according to one embodiment of the present disclosure of a ternary in memory deep neural network (TiM-DNN) accelerator.

These arrangements can thus lead to a TiM accelerator. Referring to FIG. 10, a block diagram is show representing one embodiment of the TiM-DNN accelerator, which has a hierarchical organization with multiple banks, wherein each bank comprises of several TiM tiles, an activation buffer, a partial sum (Psum) buffer, a global Reduce Unit (RU), a Special Function Unit (SFU), an instruction memory (Inst Mem), and a Scheduler. The compute time and energy in Ternary DNNs are heavily dominated by vector-matrix multiplications which are realized using TiM tiles. Other DNN functions, viz., ReLU, pooling, normalization, Tanh and Sigmoid are performed by the SFU. The partial sums produced by different TiM tiles are reduced using the RU, whereas the partial sums produced by separate blocks within a tile are reduced using PCUs, as discussed herein. TiM-DNN has a small instruction memory and a Scheduler that read instructions and orchestrates operations inside a bank. TiM-DNN also contains activation and Psum buffers to store activations and partial sums, respectively.

Figure 11:
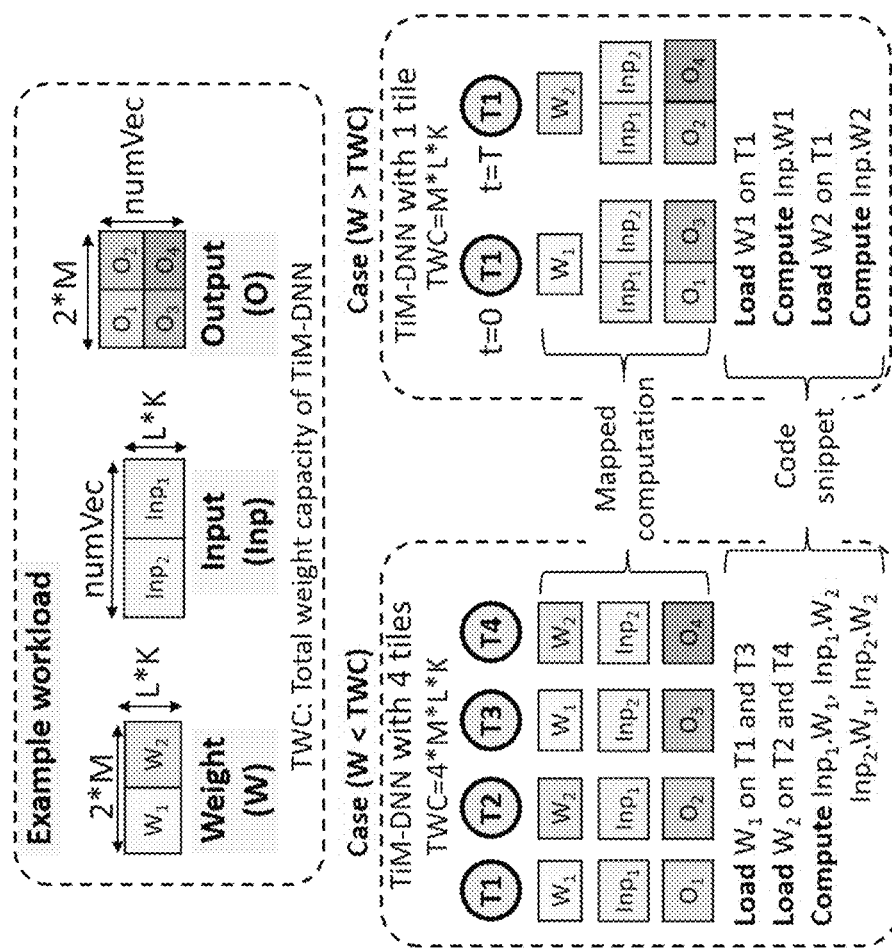
FIG. 11 is a schematic of two scenarios according to the present disclosure using an exemplary workload (vector-matrix multiplication) executed on two separate TiM-DNN instances differing in the number of TiM tiles.

DNNs can be mapped to TiM-DNN both temporally and spatially. The networks that fit on TiM-DNN entirely are mapped spatially, wherein the weight matrix of each convolution (Conv) and fully-connected (FC) layer is partitioned and mapped to dedicated (one or more) TiM tiles, and the network executes in a pipelined fashion. In contrast, networks that cannot fit on TiM-DNN at once are executed using the temporal mapping strategy, wherein we execute Conv and FC layers sequentially over time using all TiM tiles. The weight matrix (W) of each CONV/FC layer could be either smaller or larger than the total weight capacity (TWC) of TiMDNN. Referring to FIG. 11, a schematic of two scenarios using an example workload (vector-matrix multiplication) is illustrated that is executed on two separate TiM-DNN instances differing in the number of TiM tiles. As shown, when (W<TWC) the weight matrix partitions (W1 & W2) are replicated and loaded to multiple tiles, and each TiM tile computes on input vectors in parallel. In contrast, when (W>TWC), the operations are executed sequentially using multiple steps.

Figure 12:
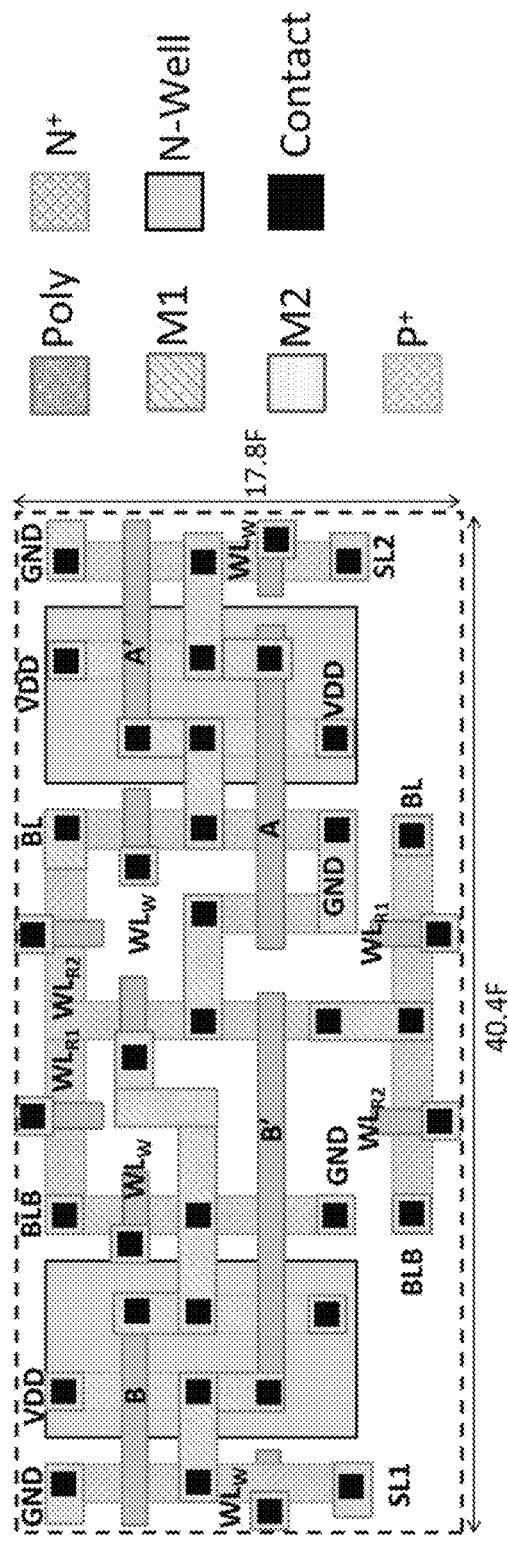
FIG. 12 is a layout of a TPC according to the present disclosure.

To evaluate the performance, the following section of the present disclosure provides reduction to practice of the novel arrangement of TiM. Detailed SPICE simulations were carried out to estimate the tile-level energy and latency for the write and vector-matrix multiplication operations. The simulations are performed using 32 nm bulk CMOS technology and PTM models. We use 3-bit flash ADCs to convert bitline voltages to digital values. To estimate the area and latency of digital logic both within the tiles (PCUs and decoders) and outside the tiles (SFU and RU), we synthesized RTL implementations using Synopsys Design Compiler and estimated power consumption using Synopsys Power Compiler. We developed a TPC layout (FIG. 12, which is an exemplary layout) to estimate its area, which is about $720F^2$ (where F is the minimum feature size). We also performed the variation analysis to estimate error rates due to incorrect sensing by considering variations in transistor VT ($\sigma/\mu=5\%$).

For system level simulation, an architectural simulator was developed to estimate application-level energy and performance benefits of TiM-DNN. The simulator maps various DNN operations, viz., vector-matrix multiplications, pooling, Relu, etc. to TiM-DNN components and produces execution traces consisting of off-chip accesses, write and in-memory operations in TiM tiles, buffer reads and writes, and RU and SFU operations. Using these traces and the timing and energy models from circuit simulation and synthesis, the simulator computes the application-level energy and performance.

Table I details the microarchitectural parameters for the instance of TiM-DNN used in the evaluation of the present disclosure, which contains 32 TiM tiles, with each tile having 256×256 TPCs. The SFU includes 64 Relu units, 8 vector processing elements (vPE) each with 4 lanes, 20 special function processing elements (SPEs), and 32 Quantization Units (QU). SPEs computes special functions such as Tanh and Sigmoid. The output activations are quantized to ternary values using QUs. The latency of the dot-product operation is 2.3 ns. TiM-DNN can achieve a peak performance of 114 TOPs/sec, consumes ~0.9 W power, and occupies ~1.96 $mm^2$ chip area.

TABLE I

TiM-DNN micro-architectural parameters

| Components | Values |
|---|---|
| No. of processing tiles | 32 TiM tiles |
| TiM tile | 256 × 256 TPCs, 32 PCUs, (M = 32, N = 256, L = K = 16) |
| Buffer (Activation + Psum) | 16 KB + 8 KB |
| I-Mem | 128 entries |
| Global Reduced Unit (RU) | 256 adders (12 bit) |
| Special function unit (SFU) | 64 ReLUs, 8vPE with 4 lanes, 20 SPEs, 32 QUs |
| Main memory | HBM2 (256 GB/s) |

Figure 13:
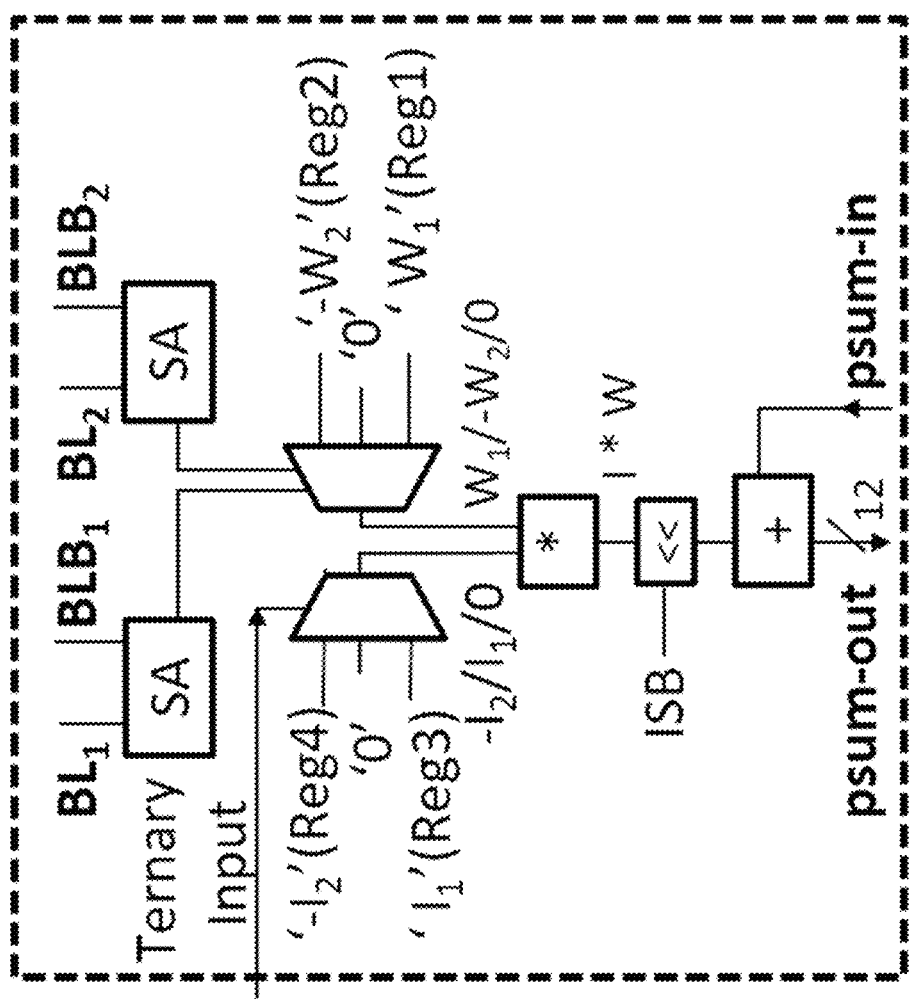
FIG. 13 is a schematic of a near memory compute unit used as a baseline of comparison for the TPC of the present disclosure.

The processing efficiency (TOPS/W) of TiM-DNN is 300× better than NVIDIA's state-of-the art Volta V100 GPU. This is to be expected, since the GPU is not specialized for ternary DNNs. In comparison to near-memory ternary accelerators, TiMDNN achieves 55.2× improvement in TOPS/W. To perform a fairer comparison and to report the benefits exclusively due to in-memory computations enabled by the proposed TPC, we design a well-optimized near-memory ternary DNN accelerator. This baseline accelerator differs from TiM-DNN in only one aspect—tiles include regular SRAM arrays (256×512) with 6T bit-cells and near-memory compute (NMC) units (shown in FIG. 13, which is a schematic of near memory compute unit for the baseline design), instead of the TiM tiles. Note that, to store a ternary word using the SRAM array, two 6T bit-cells are required. The baseline tiles are smaller than TiM tiles by 0.52×, therefore, we use two baselines designs. These include: (i) An iso-area baseline with 60 baseline tiles and the overall accelerator area is same as TiM-DNN; and (ii) An iso-capacity baseline with the same weight storage capacity (2 Mega ternary words) as TiM-DNN. It should be noted that the baseline is well-optimized, and the iso-area baseline can achieve 21.9 TOPs/sec, reflecting an improvement of 17.6× in TOPs/sec over near-memory accelerator for ternary DNNs reported in the prior art.

System-level energy and performance benefits of TiM-DNN were evaluated using a suite of DNN benchmarks. Table II details the benchmark applications. We use state-of-the-art convolutional neural networks (CNN), viz., AlexNet, ResNet-34, and Inception to perform image classification on ImageNet. We also evaluate popular recurrent neural networks (RNN) such as LSTM and GRU that perform language modeling task on the Penn Tree Bank (PTB) dataset. Table II also details the activation precision and accuracy of these ternary networks.

TABLE II

DNN benchmarks

| Application | CNN Network | FP32 Accuracy | Ternary network | | |
|---|---|---|---|---|---|
| | | | Precision [A, W] | Accuracy | Quantization method |
| Image Classification on ImageNet | AlexNet | 56.5% | [2, T] | 55.8% | WRPN |
| | ResNet-34 | 73.59% | [2, T] | 73.32% | WRPN |
| | Inception | 71.64% | [2, T] | 70.75% | WRPN |

| Application | RNN Network | PPW* FP32 | Ternary network | | |
|---|---|---|---|---|---|
| | | | Precision [A, W] | PPW | Quantization method |
| Language Modeling on PTB | LSTM | 97.2 | [T, T] | 110.3 | HitNet |
| | GRU | 102.7 | [T, T] | 113.5 | HitNet |

*PPW: Perplexity per word (Lower is better)

Figure 14:
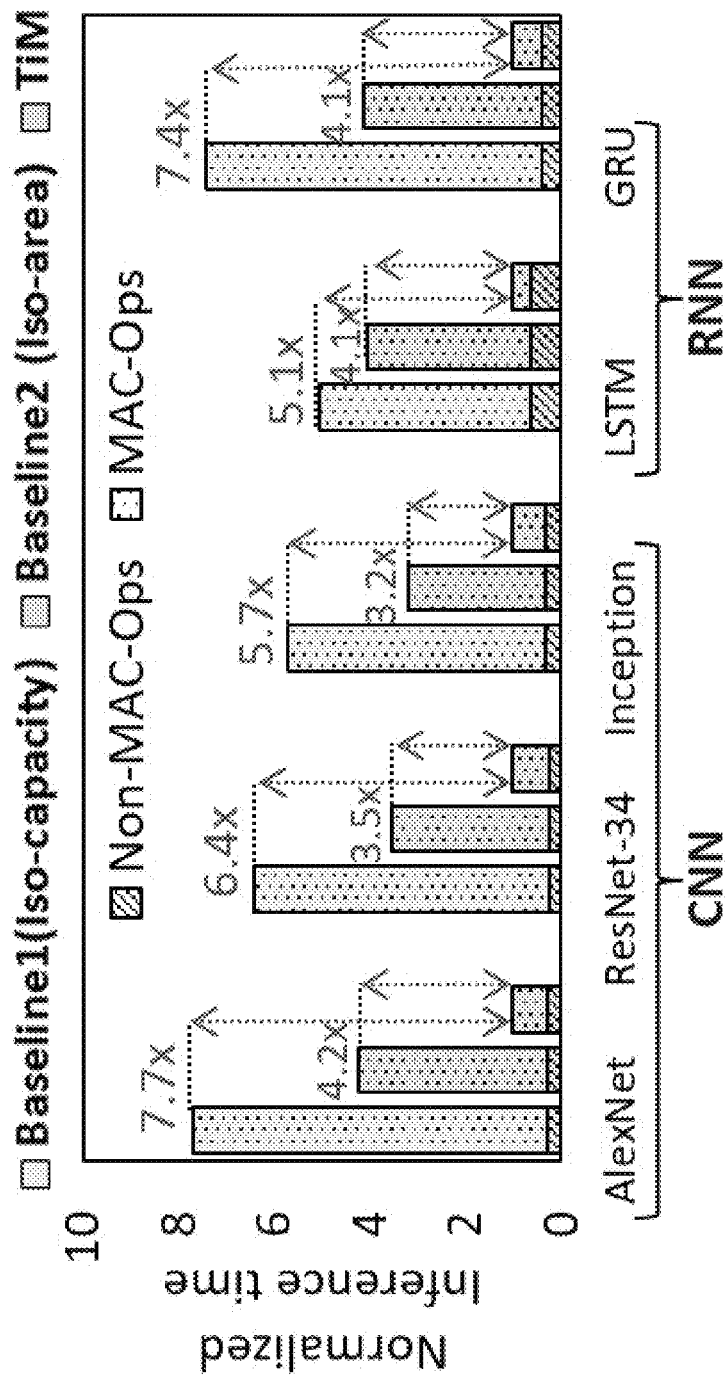
FIG. 14 is a graph of normalized energy usage for baselines vs. TiM-DNN of the present disclosure.

Reference is now made to performance benefits of TiM-DNN over the aforementioned baselines (Iso-capacity and Iso-area near-memory accelerators). Referring to FIG. 14, which provide graphs of normalized energy usage for baselines vs. TiM-DNN. FIG. 14 shows the two major components of the normalized inference time which are MAC-Ops (vector matrix multiplications) and Non-MAC-Ops (other DNN operations) for TiM-DNN (TiM) and the baselines. Overall, we achieve 5.1×-7.7× speedup over the Iso-capacity baseline and 3.2×-4.2× speedup over the Iso-area baseline across our benchmark applications. The speedups depend on the fraction of application runtime spent on MAC-Ops, with DNNs having higher MAC-Ops times attaining superior speedups. This is expected as the performance benefits of TiM-DNN over the baselines derive from accelerating MAC-Ops using in-memory computations. Iso-area (baseline2) is faster than Iso-capacity (baseline1) due to the higher-level of parallelism available from the additional baseline tiles. The 32-tile instance of TiMDNN achieves 4827, 952, 1834, 2*10$^6$, and 1.9*10$^6$ inference/sec for AlexNet, ResNet-34, Inception, LSTM, and GRU, respectively. Our RNN benchmarks (LSTM and GRU) fit on TiM-DNN entirely, leading to better inference performance than CNNs.

Figure 15:
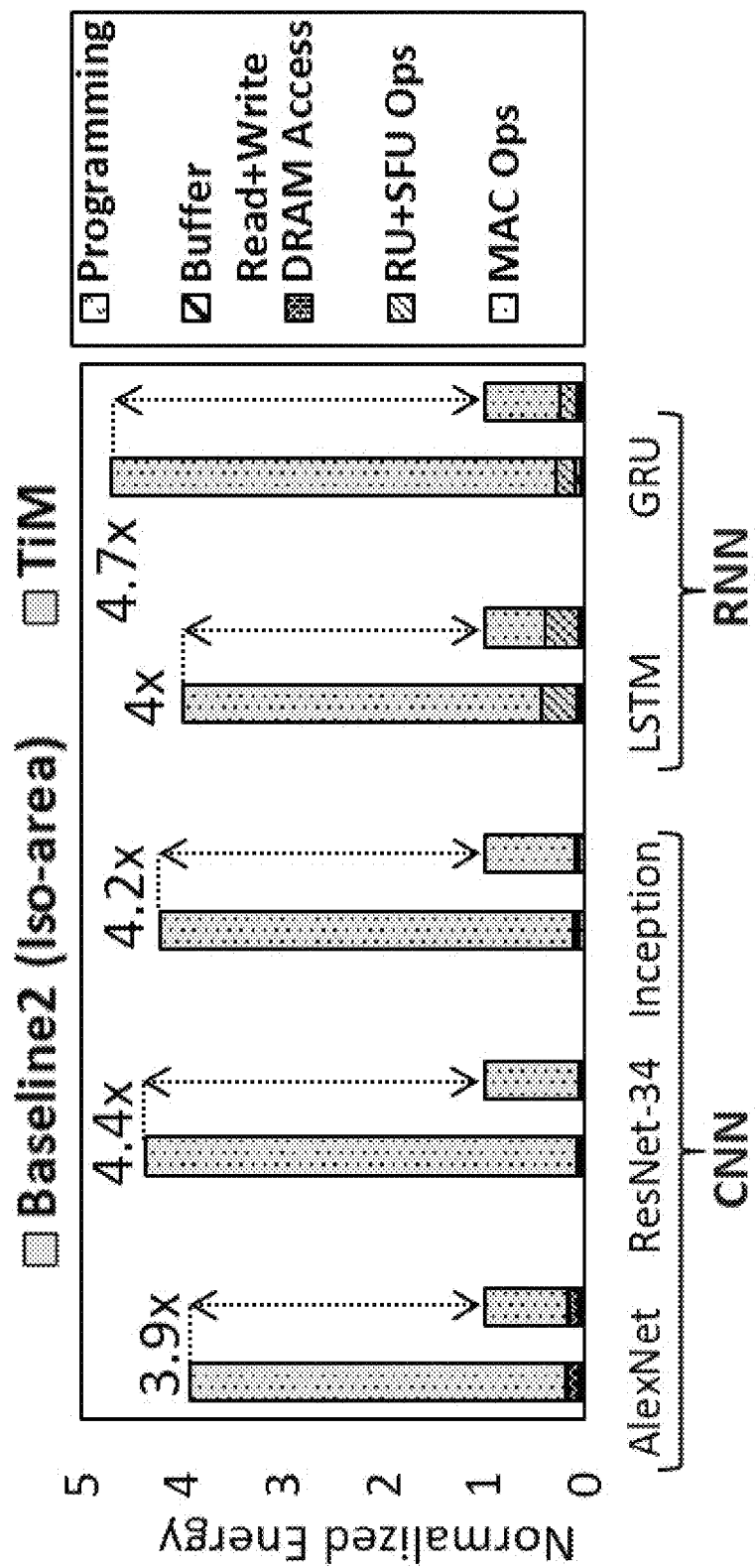
FIG. 15 is a graph of normalized energy comparison of TiM of the present disclosure is shown vs. a second baseline.

Besides performance benefits, there are energy benefits which are particularly important since DNNs can be high-energy consuming devices. To this end, the application level energy benefits of TiM-DNN are compared over the superior of the two baselines (Baseline2). Referring to FIG. 15, a graph of normalized energy comparison of TiM is shown vs. Baseline2 (Iso-Area). FIG. 15 shows major energy components for TiM-DNN and Baseline2, which are programming (writes to TiM tiles), DRAM accesses, reads (writes) from (to) activation and Psum buffers, operations in reduce units and special function units (RU+SFU Ops), and MAC-Ops. As shown, TiM reduces the MAC-Ops energy substantially and achieves 3.9×-4.7× energy improvements across our DNN benchmarks. The primary cause for this energy reduction is that TiM-DNN computes on 16 rows simultaneously per array access.

Figure 16:
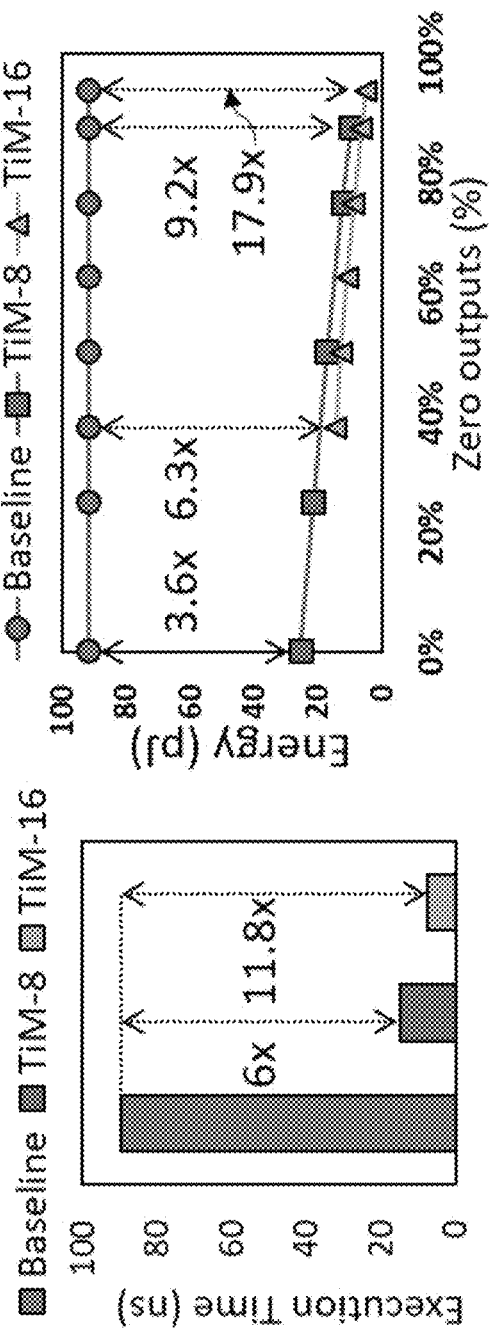
FIG. 16 shows graphs of execution time and energy for a baseline, and two TiMs according to the present disclosure.

In addition to performance and energy, there are also kernel benefits. To provide more insights on the application-level benefits, we compare the TiM tile and the baseline tile at the kernel level. We consider a primitive DNN kernel, i.e., a vector matrix computation (Out=Inp*W, where Inp is a 1×16 vector and W is a 16×256 matrix), and map it to both TiM and baseline tiles. We use two variants of TiM tile, (i) TiM-8 and TiM-16, wherein we simultaneously activate 8 wordlines and 16 wordlines, respectively. Using the baseline tile, the vector-matrix multiplication operation requires row-by-row sequential reads, resulting in 16 SRAM accesses. In contrast, TiM-16 and TiM-8 require 1 and 2 accesses, respectively. Referring to FIG. 16 graphs of execution time and energy are provided. FIG. 16 shows that the TiM-8 and TiM-16 designs achieve a speedup of 6× and 11.8× respectively, over the baseline design. Note that the benefits are lower than 8× and 16×, respectively, as SRAM accesses are faster than TiM-8 and TiM-16 accesses. Next, we compare the energy consumption in TiM-8, TiM16, and baseline designs for the above kernel computation. In TiM-8 and TiM-16, the bit-lines are discharged twice and once, respectively, whereas, in the baseline design the bitlines discharge multiple (16*2) times. Therefore, TiM tiles achieve substantial energy benefits over the baseline design. The additional factor '2' in (16*2) arises as the SRAM array uses two 6T bit-cells for storing a ternary word. However, the energy benefits of TiM-8 and TiM-16 is not 16× and 32×, respectively, as TiM tiles discharge the bitlines by a larger amount (multiple $\Delta$s). Further, the amount by which the bitlines get discharged in TiM tiles depends on the number of non-zero scalar outputs. For example, in TiM-8, if 50% of the TPCs output in a column are zeros the bitline discharges by 4$\Delta$, whereas if 75% are zeros the bitline discharges by 2$\Delta$. Thus, the energy benefits over the baseline design are a function of the output sparsity (fraction of outputs that are zero). FIG. 16 shows the energy benefits of TiM-8 and TiM16 designs over the baseline design at various output sparsity levels.

Figure 17:
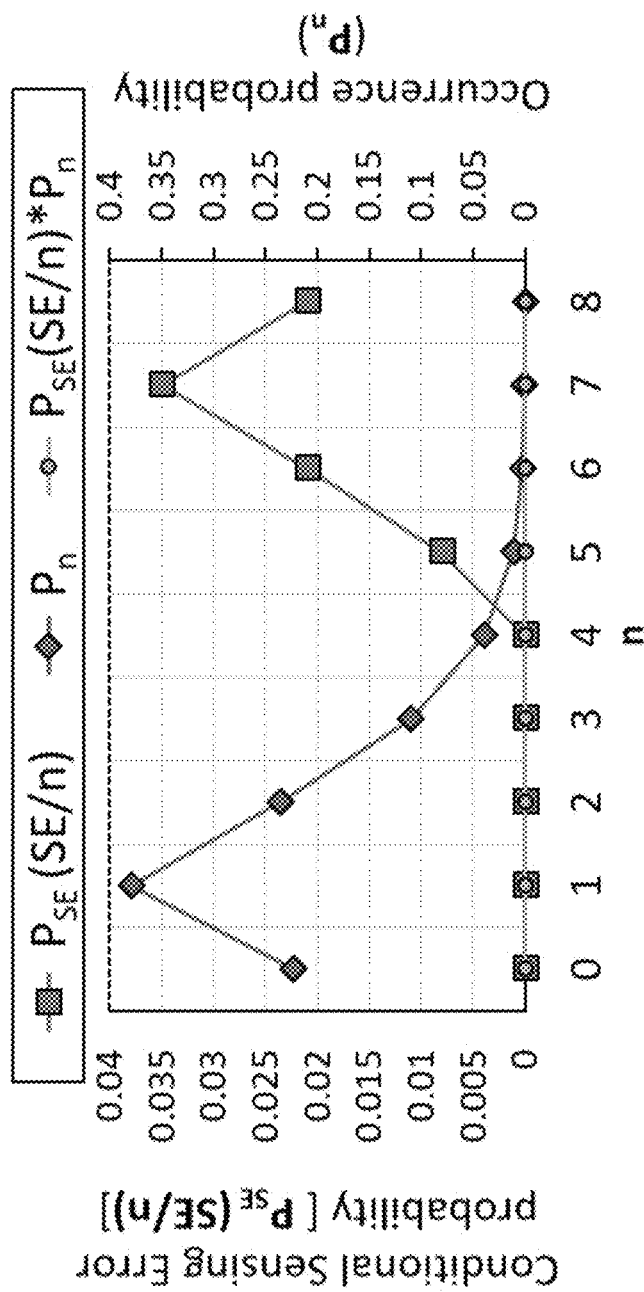
FIG. 17 is a histogram of MonteCarlo analysis across random samples of ternary dot-product operations executed in TiM tiles with nmax=8 and L=16.
Figure 18:
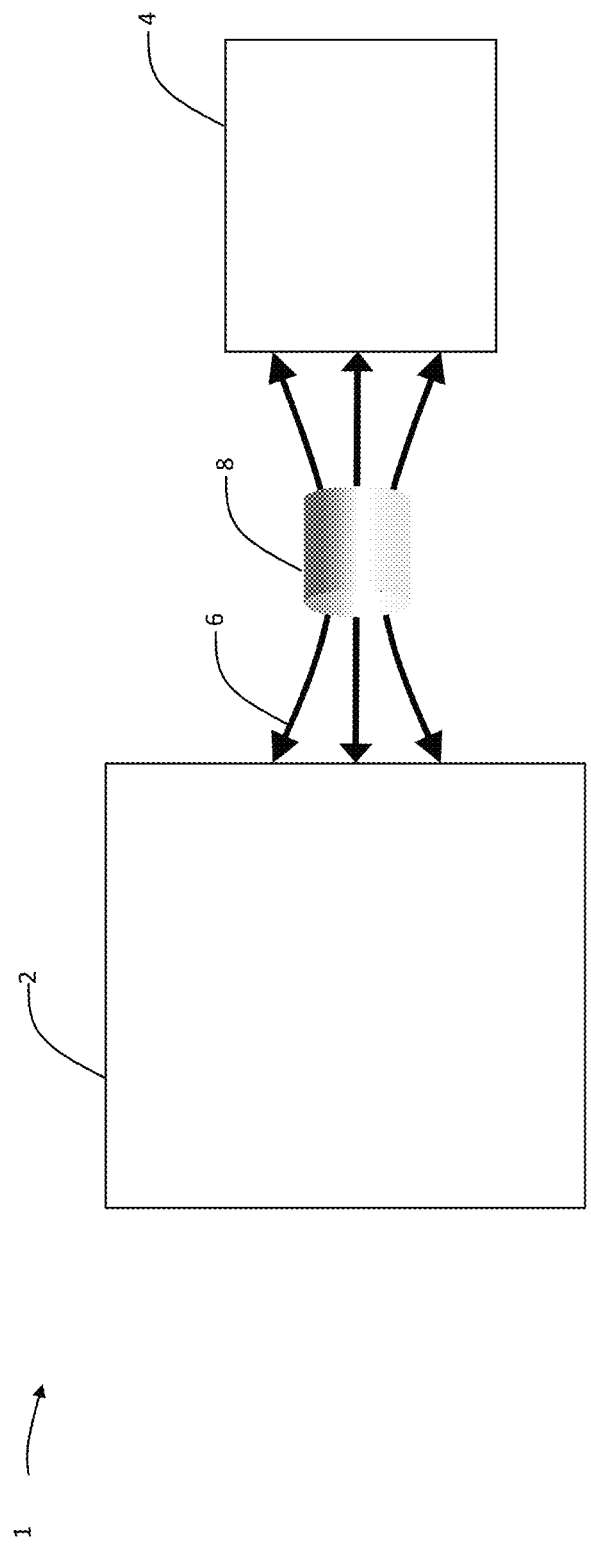
FIG. 18 is a schematic of an architecture of the prior art, where a memory is decoupled from the processor, and where the memory and the processor communicate via a data exchange bus.

The impact of process variation on the computations (i.e., ternary vector-matrix multiplications) performed using TiM-DNN is of a concern. To that end, we first perform Monte-Carlo circuit simulation of ternary dot-product operations executed in TiM tiles with nmax=8 and L=16 to determine the sensing errors under random variations. We consider variations (σ/μ=5%) in the threshold voltage (VT) of all transistors in each and every TPC. We evaluate 1000 samples for every possible BL/BLB state (S0 to S8) and determine the spread in the final bitline voltages (VBL/VBLB). FIG. 17 shows the histogram of the obtained VBL voltages of all possible states across these random samples. As mentioned in section III-B, the state Si represents n=i, where 'n' is the ADC Output. We can observe in the figure that some of the neighboring histograms slightly overlap, while the others do not. For example, the histograms S7 and S8 overlap but S1 and S2 do not. The overlapping areas in the figure represent the samples that will result in sensing errors (SEs). However, the overlapping areas are very small, indicating that the probability of the sensing error (PSE) is extremely low. Further, the sensing errors depend on 'n', and we represent it as the conditional sensing error probability [PSE(SE/n)]. It should be noted that error magnitude is always 1, as only the adjacent histograms overlap.

Equation 1 details the probability ($P_E$) of error in the ternary vector-matrix multiplications executed using TiM tiles, where $P_{SE}(SE/n)$ and $P_n$ are the conditional sensing error probability and the occurrence probability of the state $S_n$ (ADC-Out=n), respectively. FIG. 17 shows the values of $P_{SE}(SE/n)$, $P_n$, and their product ($P_{SE}(SE/n)*P_n$) for each n. The $P_{SE}(SE/n)$ is obtained using the Monte-Carlo simulation (described above), and $P_n$ is computed using the traces of the partial sums obtained during ternary vector matrix multiplications executed using TiM tiles. As shown in FIG. 17, the $P_n$ is maximum at n=1 and drastically decreases with a higher value of n. In contrast, the $P_{SE}(SE/n)$ shows an opposite trend, wherein the probability of sensing error is higher for larger n. Therefore, we find the product $P_{SE}(SE/n)*P_n$ to be quite small across all values on n. In our evaluation, the $P_E$ is found to be $1.5*10^{-4}$, reflecting an extremely low probability of error. In other words, we have only 2 errors of magnitude (1) every 10K ternary vector matrix multiplications executed using TiM-DNN. In our experiments, we found that $P_E=1.5*10^{-4}$ has no impact on the application level accuracy. We note that this is due to the low probability and magnitude of error as well as the ability of DNNs to tolerate errors in their computations.

$$P_E = \sum_{n=0}^{8} P_{SE}(SE/n) * P_n \quad (1)$$

Those having ordinary skill in the art will recognize that numerous modifications can be made to the specific implementations described above. The implementations should not be limited to the particular limitations described. Other implementations may be possible.

The invention claimed is:

1. A circuit of cells used as a memory array and capable of in-memory arithmetic, comprising:
a plurality of signed ternary processing cells each having a first bitline and a second bitline and coupled to each other in a parallel fashion such that the first bitlines of the plurality of signed ternary processing cells are coupled to each other and the second bitlines of the plurality of signed ternary processing cells are coupled to each other, each signed ternary processing cell comprising:
a first memory cell, adapted to hold a first digital value;
a second memory cell, adapted to hold a second digital value, wherein a binary combination of the first digital value and the second digital value establishes a first signed ternary operand;
a signed ternary input forming a second signed ternary operand; and
a signed ternary output, wherein the signed ternary output represents a signed multiplication of the first signed ternary operand and the second signed ternary operand by voltage changes in the first and second bitlines;
a sense circuit adapted to (a) receive the coupled first and second bitlines of the plurality of signed ternary processing cells, (b) compute the difference between the values represented by the coupled first bitlines and the coupled second bitlines, and (c) output a subtraction result, wherein each signed ternary processing cell further comprising:
a first bitline coupled to the first memory cell;
a second bitline coupled to the second memory cell;
a first read wordline; and
a second read wordline, wherein the multiplication of the first signed ternary operand and the second signed ternary operand is generated by (a) precharging the first and second bitlines, (b) selectively and temporarily activating the first and second read wordlines, and (c) comparing the first and second bitlines and inferring the multiplication output based on the comparison results.

2. The circuit of claim 1, wherein for each signed ternary processing cell, the first signed ternary operand, the second signed ternary operand, and the multiplication output are encoded as one of three digital values (−1,0,1), and wherein the outputted subtraction result is the dot product $\Sigma_{i=1}^{n}(I([i]W[i])$ where n is the number of signed ternary processing cells, W is a vector representing the first signed ternary operands and I is a vector representing the second signed ternary operands.

3. The circuit of claim 2, wherein each of the first and the second memory cells is comprised of a network of transistors.

4. The circuit of claim 2, wherein the first memory cell of each signed ternary processing cell includes a first cross-coupled set of inverters and the second memory cell of each signed ternary processing cell includes a second cross-coupled set of inverters.

5. The circuit of claim 1, wherein for each signed ternary processing cell, the first signed ternary operand is encoded as one of three digital values (−$W_2$,0,$W_1$) and the second signed ternary operand is encoded as one of three digital values (−$I_2$,0,$I_1$), and the outputted subtraction result is the dot product $\Sigma_{i=1}^{n}(I([i]W[i])$, where n is the number of signed ternary processing cells, W is a vector representing the first signed ternary operands and I is a vector representing the second signed ternary operands.

6. The circuit of claim 5, each signed ternary processing cell further comprising:
a write wordline coupled to the first and second memory cells;
a first source line coupled to the first memory cell, and a second source line coupled to the second memory cell;
wherein when the write wordline is activated, and the first and second source lines are selectively activated, the first and second memory cells can be selectively overwritten.

7. The circuit of claim 6, each signed ternary processing cell further comprising:

where by (a) precharging the first and second source lines and the first and second bitlines, (b) temporarily activating the write wordline, and (c) comparing voltage on the first and second bitlines with corresponding voltage on the first and second source lines, the values held in the first and second memory cells are determinable.

\* \* \* \* \*